(12) United States Patent
Hatae et al.

(10) Patent No.: US 8,614,566 B2
(45) Date of Patent: Dec. 24, 2013

(54) DC-DC CONVERTER

(75) Inventors: Shinji Hatae, Tokyo (JP); Khalid Hassan Hussein, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 340 days.

(21) Appl. No.: 13/182,837

(22) Filed: Jul. 14, 2011

(65) Prior Publication Data

US 2012/0068678 A1 Mar. 22, 2012

(30) Foreign Application Priority Data

Sep. 22, 2010 (JP) ................................ 2010-211840

(51) Int. Cl.
*G05F 1/24* (2006.01)

(52) U.S. Cl.
USPC ...................................... 323/259; 363/56.05

(58) Field of Classification Search
USPC ............ 363/16–20, 34–39, 51, 56.05, 56.12, 363/56.02, 21.01, 89, 98, 132; 323/222, 323/224, 225, 249, 259, 262, 282–285
See application file for complete search history.

(56) References Cited

U.S. PATENT DOCUMENTS

| | | | |
|---|---|---|---|
| 4,639,849 A * | 1/1987 | Noworolski et al. | 363/56.05 |
| 5,550,458 A * | 8/1996 | Farrington et al. | 323/222 |
| 5,615,095 A * | 3/1997 | Reynolds et al. | 363/56.02 |
| 5,633,579 A * | 5/1997 | Kim | 323/222 |
| 5,736,842 A | 4/1998 | Jovanovic | |
| 6,169,672 B1 | 1/2001 | Kimura et al. | |
| 6,801,443 B2 * | 10/2004 | Manthe | 363/56.12 |
| 2008/0169792 A1 | 7/2008 | Orr | |
| 2010/0182813 A1 | 7/2010 | Asano et al. | |

FOREIGN PATENT DOCUMENTS

| | | |
|---|---|---|
| EP | 0 195 713 A1 | 9/1986 |
| JP | 10-146048 | 5/1998 |
| JP | 2001-309647 | 11/2001 |
| JP | 2004-201369 | 7/2004 |
| JP | 2008-206282 | 9/2008 |

OTHER PUBLICATIONS

Office Action issued Apr. 24, 2013, in German Patent Application No. 102011 082 706.4 with English translation.

* cited by examiner

*Primary Examiner* — Rajnikant Patel
(74) *Attorney, Agent, or Firm* — Oblon, Spivak, McClelland, Maier & Neustadt, L.L.P.

(57) ABSTRACT

Provided is a DC-DC converter capable of reducing not only a turn-off loss but also a turn-on loss. A snubber capacitor has one end connected to an anode of a step-up diode, a current input end of a step-up switching element and a main reactor. A first snubber diode has a cathode connected to other end of the snubber capacitor, and an anode connected to a cathode of the step-up diode. A second snubber diode has an anode connected to the cathode of the first snubber diode and other end of the snubber capacitor. A snubber reactor has one end connected to the anode of the first snubber diode, and other end connected to a cathode of the second snubber diode.

31 Claims, 17 Drawing Sheets

F I G . 1
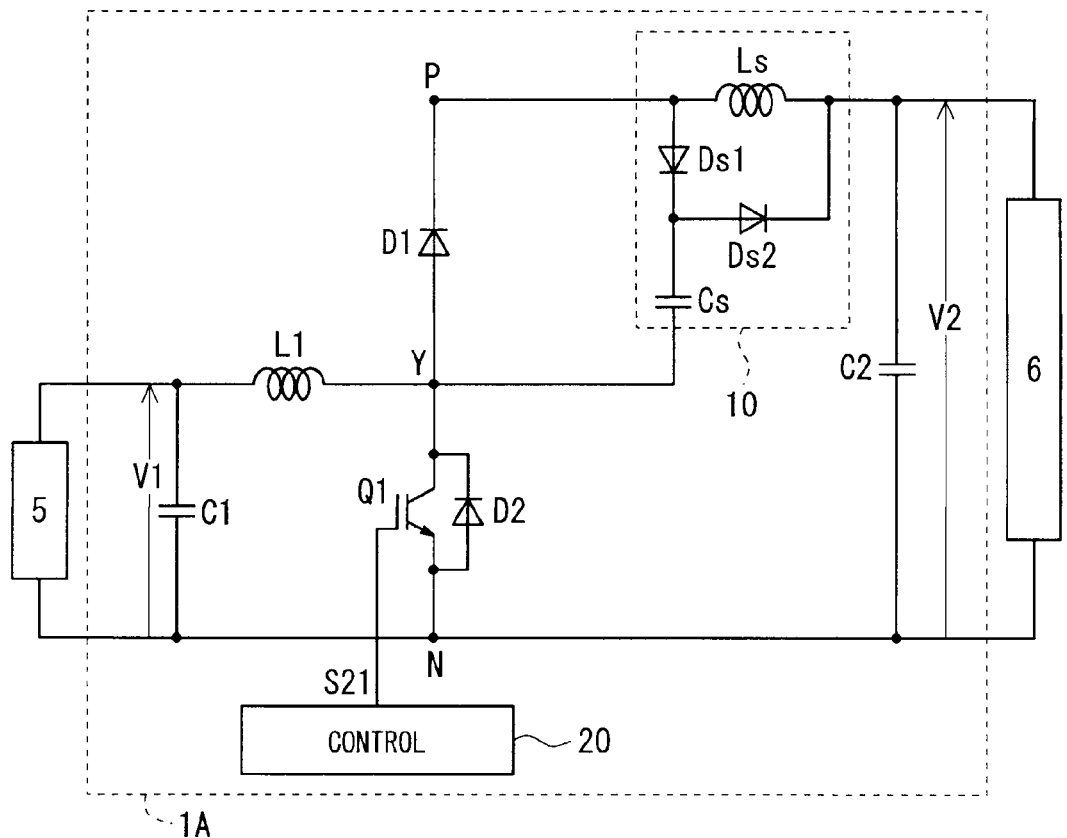
F I G . 2
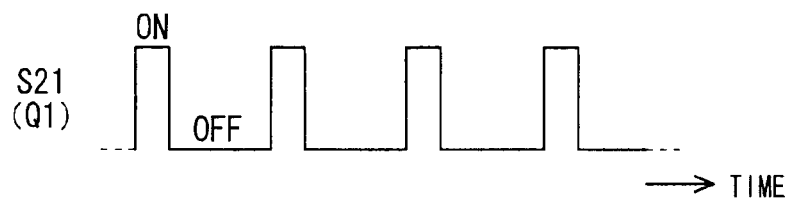

F I G . 1 3
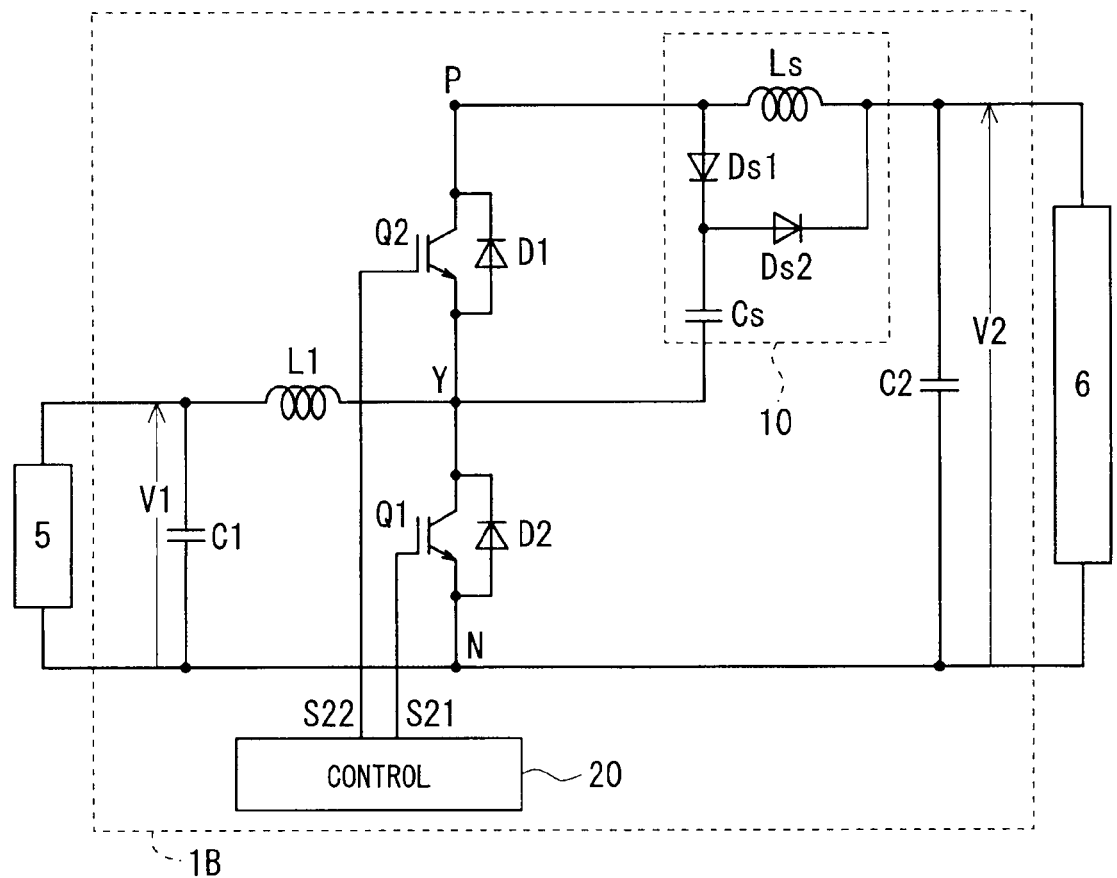

F I G . 2 7
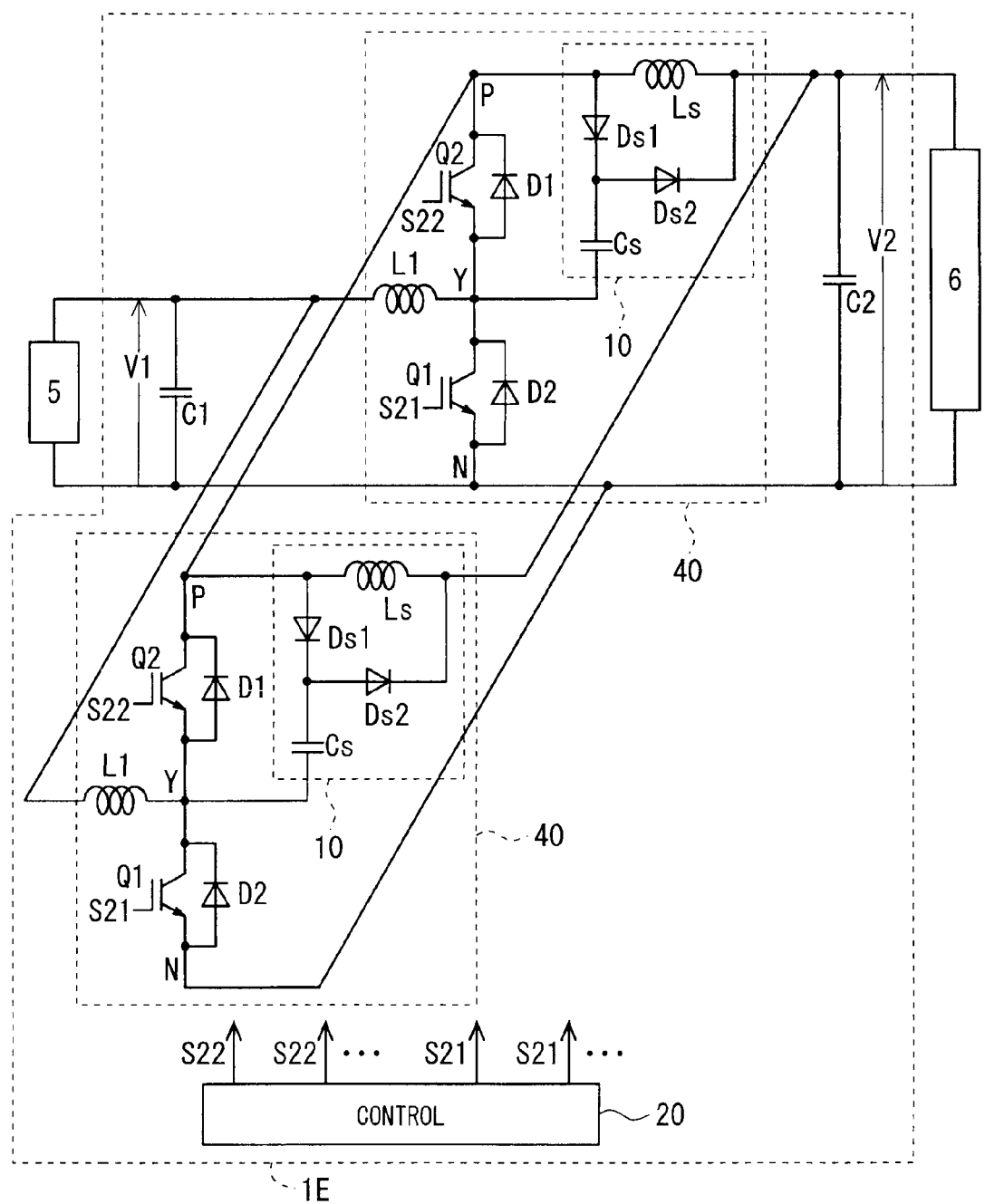

F I G . 2 8
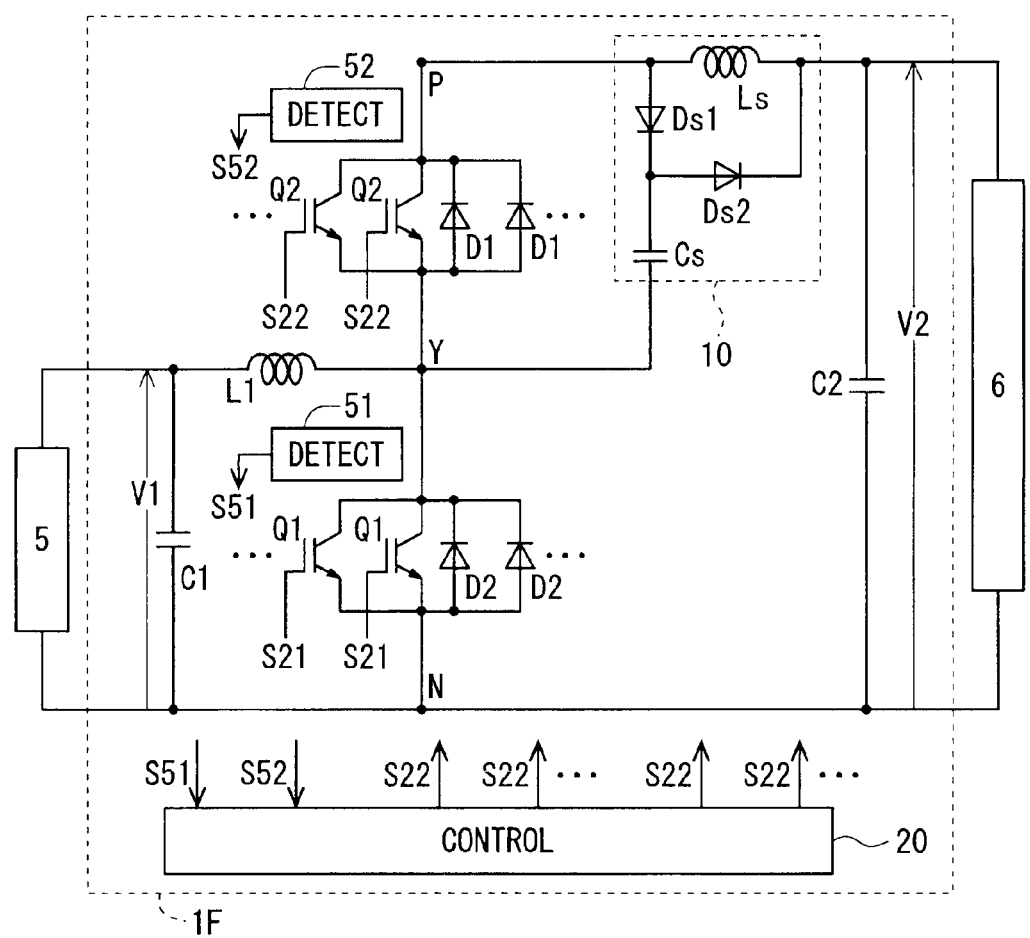
F I G . 2 9
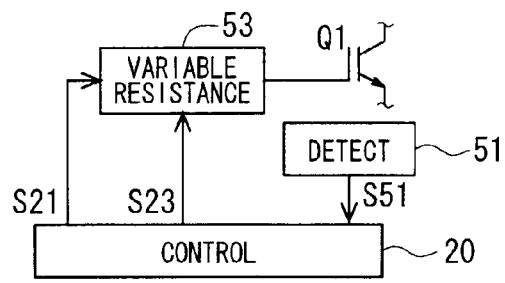

F I G . 3 0
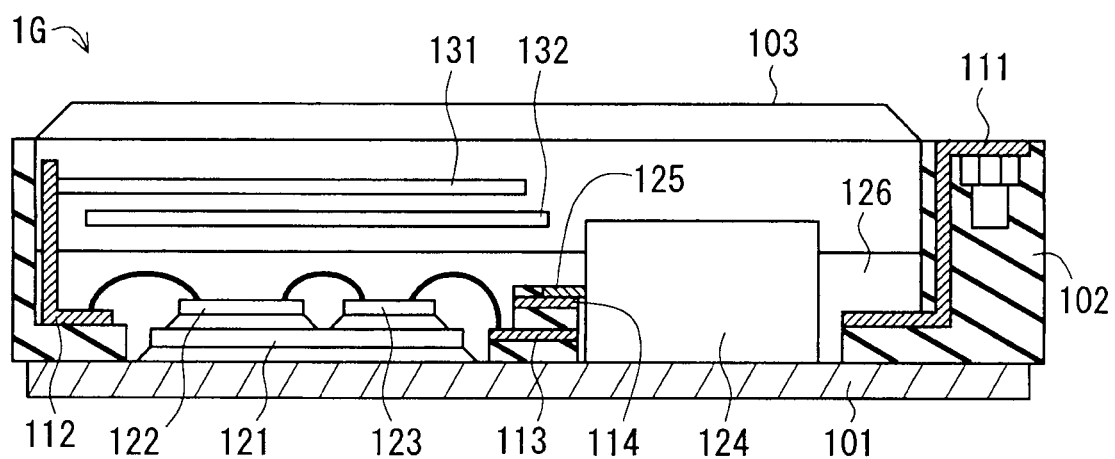

DC-DC CONVERTER

BACKGROUND OF THE INVENTION

1. Field of the Invention

The present invention relates to a DC-DC converter.

2. Description of the Background Art

In a power step-up DC-DC converter that handles a high voltage and a large current, a switching frequency by a chopper circuit is increased, whereby efficiency enhancement and downsizing of a device can be achieved. However, the increase of the frequency results in an increase of a switching loss of a power semiconductor element that performs switching. Accordingly, from a viewpoint of the switching loss, the increase of the frequency becomes a cause to inhibit the efficiency enhancement and downsizing of the device. Note that such a problem is not limited to the power step-up converter.

In order to reduce the switching loss, a soft switching circuit is sometimes used. In Japanese Patent Application Laid-Open No. 2004-201369, there is described a soft switching circuit for reducing a switching loss at the time when a switching element is turned off.

However, in the soft switching circuit of Japanese Patent Application Laid-Open No. 2004-201369, a switching loss at turn-on cannot be reduced. Specifically, when the switching element is turned on, the switching element causes hard switching owing to a recovery current of a diode.

SUMMARY OF THE INVENTION

It is an object of the present invention to provide a DC-DC converter capable of reducing not only the turn-off loss but also the turn-on loss.

A DC-DC converter according to one aspect of the present invention includes a main reactor, at least one step-up switching element, at least one step-up diode, a snubber capacitor, a first snubber diode, a second snubber diode, a snubber reactor, and a capacitor. The main reactor has one end and other end. The at least one step-up switching element has a current input end connected to the other end of the main reactor, a current output end to be connected to a ground potential, and a control end that receives a control signal for controlling on/off between the current input end and the current output end. The at least one step-up diode has an anode connected to the current input end of the at least one step-up switching element and the other end of the main reactor. The snubber capacitor has one end connected to the anode of the at least one step-up diode, the current input end of the at least one step-up switching element and the other end of the main reactor. The first snubber diode has a cathode connected to other end of the snubber capacitor, and an anode connected to a cathode of the at least one step-up diode. The second snubber diode has an anode connected to the cathode of the first snubber diode and the other end of the snubber capacitor. The snubber reactor has one end connected to the anode of the first snubber diode, and other end connected to a cathode of the second snubber diode. The capacitor has one end connected to the other end of the snubber reactor and the cathode of the second snubber diode, and other end to be connected to the ground potential.

In accordance with the aspect described above, not only the turn-off loss but also the turn-on loss can be reduced in the step-up operation. Moreover, the switching loss is reduced, whereby the efficiency enhancement and downsizing of the device can be achieved even if the switching frequency is increased. Moreover, an occurrence of electromagnetic noise can be suppressed by the soft switching. Furthermore, a snubber circuit is composed of a small number of parts, and accordingly, it is possible to suppress significant upsizing and cost increase, and further, reduction of the efficiency, which may be caused by the upsizing. Moreover, the snubber circuit does not require complicated control for itself, and accordingly, can easily realize the soft switching.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram schematically showing a configuration of a DC-DC converter according to a first preferred embodiment;

FIG. 2 is a waveform chart schematically showing switching of the DC-DC converter according to the first preferred embodiment;

FIG. 13 is a circuit diagram schematically showing a configuration of a DC-DC converter according to a second preferred embodiment;

FIG. 27 is a circuit diagram schematically showing a configuration of a DC-DC converter according to a fifth preferred embodiment;

FIG. 28 is a circuit diagram schematically showing a configuration of a DC-DC converter according to a sixth preferred embodiment;

FIG. 29 is a circuit diagram schematically showing a configuration of the DC-DC converter according to the sixth preferred embodiment; and FIG. 30 is a cross-sectional view schematically showing a device structure of a DC-DC converter according to a seventh preferred embodiment.

DESCRIPTION OF THE PREFERRED EMBODIMENTS

First Preferred Embodiment

Figure 3:
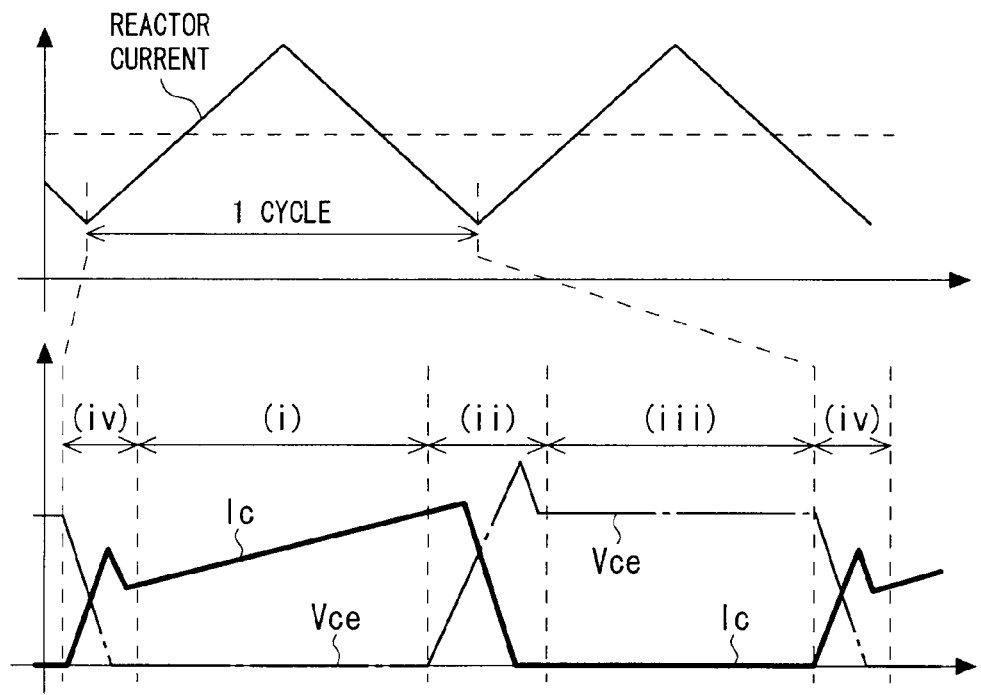
FIG. 3 is a waveform chart schematically showing a variety of waveforms in a step-up operation of the DC-DC converter according to the first preferred embodiment.

FIG. 1 shows a circuit diagram schematically showing a configuration of a DC-DC converter (hereinafter, sometimes abbreviated as a converter) 1A according to a first preferred embodiment. As illustrated in FIG. 1, the converter 1A is used by being connected between a low voltage-side device 5 and a high voltage-side device 6. In other words, the low voltage-side device 5 is connected to low voltage-side connection ends of the converter 1A, and the high voltage-side device 6 is connected to high voltage-side connection ends of the converter 1A.

The converter 1A is a step-up converter, and has a configuration capable of executing a step-up operation in which a voltage V1 on the low voltage-side connection ends is stepped up to a voltage V2 (>V1) and the stepped-up voltage V2 is outputted to the high voltage-side connection ends. In other words, the converter 1A steps up the voltage V1, which is applied thereto by the low voltage-side device 5, to the voltage V2, and supplies the stepped-up voltage V2 to the high voltage-side device 6.

Note that, in the step-up operation, the low voltage-side connection ends are also referred to as input side or primary side, and the high voltage-side connection ends are also referred to as output side or secondary side.

In response to the step-up operation, the case where the low voltage-side device 5 is a direct-current power supply (DC power supply) is illustrated below, and the low voltage-side device 5 is also referred to below as a DC power supply 5. Moreover, the case where the high voltage-side device 6 is a variety of loads is illustrated below, and the high voltage-side device 6 is also referred to below as a load 6.

Moreover, the case is illustrated below, where the converter 1A is composed as a power device that handles a relatively high voltage and a relatively large current, however, for example, the converter 1A is also capable of being configured so as to fit to fields of electronics products and electrical appliances.

<Configuration of Converter 1A>

The converter 1A illustrated in FIG. 1 is composed of a so-called non-insulating-type step-up chopper circuit as a basic component. The converter 1A includes a capacitor C1, a reactor L1, a switching element Q1, a diode D2, a diode D1, a capacitor Cs, a diode Ds1, a diode Ds2, a reactor Ls, a capacitor C2, and a control device 20. Note that, the control device 20 is abbreviated as "control" in the figures, and names of a variety of components to be described later are also abbreviated in the figures in some case.

The capacitor C1 has one end to be connected to a positive electrode of the DC power supply 5, and other end to be connected to a negative electrode of the DC power supply 5. That is, the capacitor C1 is connected in parallel to the DC power supply 5 at the time when the converter 1A is used. Hereinafter, the capacitor C1 is sometimes also referred to as a low voltage-side capacitor C1.

Here, the case where the capacitor C1 is included in the converter 1A is illustrated; however, the capacitor C1 may be prepared separately as an external part of the converter 1A. Moreover, it is also possible to adopt a configuration in which the capacitor C1 is not provided.

Note that, in the example of FIG. 1, a potential of the negative electrode of the DC power supply 5 is selected as a ground potential N of the converter 1A.

With regard to the reactor L1, one end thereof is connected to the above-described one end of the low voltage-side capacitor C1. That is, at the time when the converter 1A is used, the reactor L1 is connected to the positive electrode of the DC power supply 5. Moreover, the other end of the reactor 1 is connected to the switching element Q1, the diodes D2 and D1 and the capacitor Cs. Hereinafter, the reactor L1 is sometimes also referred to as a main reactor L1.

The switching element Q1 has a current input end, a current output end, and a control end. The current input end is connected to the above-described other end of the main reactor L1. The current output end is connected to the above-described other end of the low voltage-side capacitor C1, and is thereby connected to the ground potential N at the time when the converter 1A is used. The control end is connected to the control device 20, and receives, from the control device 20, a control signal S21 for controlling on/off between the current input end and the current output end. Hereinafter, the switching element Q1 is sometimes also referred to as a step-up switching element Q1.

Here, the case where the step-up switching element Q1 is composed of an insulating gate bipolar transistor (IGBT) is illustrated, and the switching element Q1 is also referred to as a transistor Q1. Moreover, the current input end, current output end, and control end of the switching element Q1 are allowed to correspond to terminals of the IGBT, and are sometimes also referred to as a collector, an emitter, and a gate, respectively. Furthermore, it is also possible to adopt other power semiconductor switching elements as the step-up switching element Q1.

The diode D2 is connected in anti-parallel to the step-up transistor Q1. That is, an anode of the diode D2 is connected to the emitter of the transistor Q1, and a cathode of the diode D2 is connected to the collector of the transistor Q1. Note that an anti-parallel connection structure by the diode D2 and the transistor Q1 is connected to between the above-described other end of the main reactor L1 and a point where the ground potential N is given. The diode D2 is a so-called free wheel diode. Note that it is also possible to omit the diode D2 from a viewpoint of the step-up operation to be described later.

With regard to the diode D1, an anode thereof is connected to the above-described other end of the main reactor L1, and a cathode thereof is connected to the diode Ds1 and the rector Ls. Hereinafter, the diode D1 is sometimes also referred to as a step-up diode D1.

Note that a cathode side of the diode D1 is sometimes also referred to as a high potential side P in comparison with the point of the ground potential N. Moreover, a connection point between the diode D1 and the transistor Q1 is sometimes also referred to as a midpoint Y in comparison with the point of the ground potential N and the high potential side P.

With regard to the capacitor Cs, one end thereof is connected to the above-described other end of the reactor L1, the collector of the transistor Q1, the cathode of the diode D2, and the anode of the diode D1. Other end of the capacitor Cs is connected to the diodes Ds1 and Ds2. Hereinafter, the capacitor Cs is sometimes also referred to as a snubber capacitor Cs.

With regard to the diode Ds1, a cathode thereof is connected to the above-described other end of the snubber capacitor Cs. An anode of the diode Ds1 is connected to the cathode of the step-up diode D1 and the reactor Ls. Hereinafter, the diode Ds1 is sometimes also referred to as a first snubber diode Ds1.

With regard to the diode Ds2, an anode thereof is connected to the cathode of the first snubber diode Ds1 and the above-described other end of the snubber capacitor Cs. A cathode of the diode Ds2 is connected to the reactor Ls and the capacitor C2. Hereinafter, the diode Ds2 is sometimes also referred to as a second snubber diode Ds2.

With regard to the reactor Ls, one end thereof is connected to the anode of the first snubber diode Ds1 and the cathode of the step-up diode D1, and other end thereof is connected to the cathode of the second snubber diode Ds2 and the capacitor C2. Hereinafter, the reactor Ls2 is sometimes also referred to as a snubber reactor Ls.

Here, the capacitor Cs, the diodes Ds1 and Ds2, and the rector Ls compose a snubber circuit 10. By adopting this snubber circuit 10, soft switching at the time when the step-up transistor Q1 is turned off and turned on is realized (to be described later).

With regard to the capacitor C2, one end thereof is connected to the above-described other end of the snubber rector Ls and the cathode of the second snubber diode Ds2. Other end of the capacitor C2 is connected to the emitter of the step-up transistor Q1 and the anode of the diode D2. In such a way, the other end of the capacitor C2 is set at the ground potential N at the time when the converter 1A is used. Hereinafter, the capacitor C2 is sometimes also referred to as a high voltage-side capacitor C2. The load 6 is connected in parallel to the high voltage-side capacitor C2.

The control device 20 performs a variety of processing of the converter 1A. For example, the control device 20 is capable of being concretized by including a microprocessor (also referred to as an MPU, a CPU and a microcomputer), and a memory provided so that the microprocessor can be accessible thereto. In the case of this example, the microprocessor executes processing steps (in other words, a processing procedure) written in a program prestored in the memory, whereby the variety of processing is performed. In other words, the control device 20 functions as a variety of means (or units) corresponding to the variety of processing.

Note that the above-described microprocessor is also capable of adopting, for example, a multiprocessor or multi-core configuration. Moreover, the above-described memory is composable by including, for example, at least one of a ROM (Read Only Memory), a RAM (Random Access Memory), and a rewritable non-volatile memory (EPROM (Erasable Programmable ROM) or the like). The memory stores a variety of data and the like as well as stores the program in such a manner as described above, and moreover, provides a work area for executing the program.

In accordance with such a configuration example, the variety of processing by the control device 20 is concretized by software; however, a part or all of such a variety of processing is realizable also by hardware.

Here, the case where the control device 20 is included in the converter 1A is illustrated; however, the control device 20 may be prepared separately as an external part of the converter 1A.

For example, the control device 20 functions as a means that controls operations of the step-up transistor Q1. More specifically, this means controls voltage application to the gate of the transistor Q1, and thereby controls on/off of the transistor Q1. In this case, a gate voltage outputted from this means corresponds to the switching control signal S21 of the transistor Q1.

FIG. 2 shows a waveform chart schematically showing the control signal S21, in other words, the operations of the transistor Q1. A duty ratio of a rectangular pulse illustrated in FIG. 2 is controlled by the control device 20, whereby the transistor Q1 is controlled to be on/off by pulse width modulation (PWM). The duty ratio is determined in response to a setting value of the step-up voltage V2. In other words, a value of the step-up voltage V2 is controlled by setting the duty ratio. Note that the waveform of the control signal S21 is not limited to a rectangular wave illustrated in FIG. 2.

<Step-Up Operation of Converter 1A>

A description is made of the step-up operation of the converter 1A with reference also to FIGS. 3 to 10.

FIG. 3 is a waveform chart schematically showing a variety of waveforms in the step-up operation. An upper stage of FIG. 3 shows a schematic waveform of a current (reactor current) flowing though the main reactor L1, and a lower stage of FIG. 3 shows schematic waveforms of a collector current Ic of the step-up transistor Q1 and a voltage Vce between the collector and emitter thereof.

FIGS. 4 to 8 schematically show flows of the current at a variety of timing in the step-up operation. Circuit diagrams in FIGS. 4 to 8 are basically the same as in FIG. 1; however, illustration of the control device 20 and the diode D2 is omitted therefrom.

Figure 9:
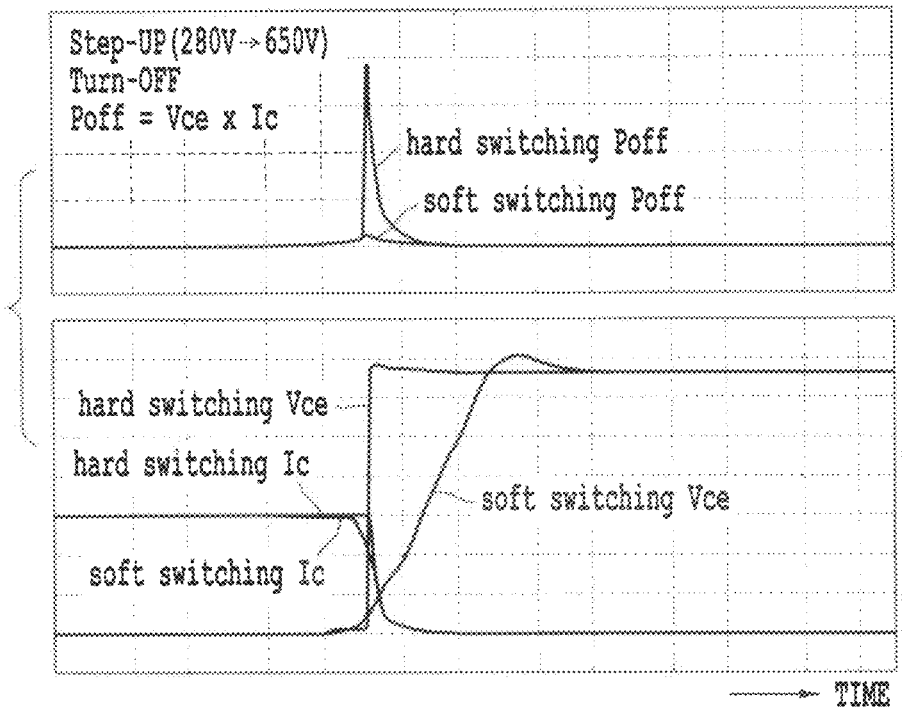
FIG. 9 is a waveform chart showing an example of the variety of waveforms in the step-up operation of the DC-DC converter according to the first preferred embodiment (turn off)
Figure 10:
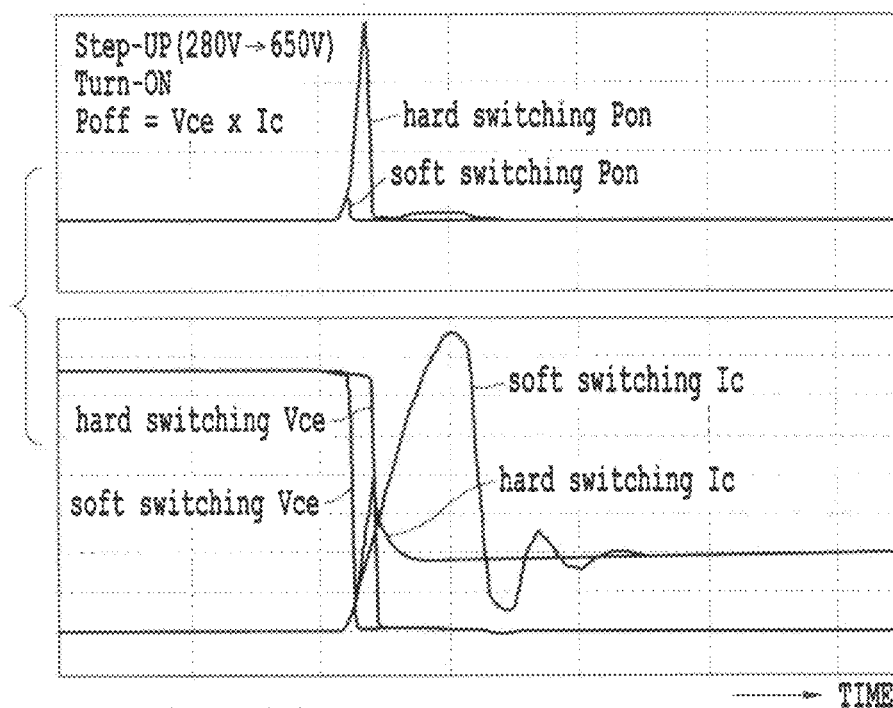
FIG. 10 is a waveform chart showing an example of the variety of waveforms in the step-up operation of the DC-DC converter according to the first preferred embodiment (turn on)

FIG. 9 is a waveform chart showing an example of a variety of waveforms at the time when the step-up transistor Q1 is turned off. A lower stage of FIG. 9 shows a collector current Ic of the transistor Q1 and a voltage Vce between the collector and emitter thereof, and an upper stage of FIG. 9 shows power (in other words, a switching loss) Poff at turn-off. For comparison, FIG. 9 also shows a waveform in the case where the snubber circuit 10 (see FIG. 1) is not provided (that is, the case of hard switching). FIG. 10 is a waveform chart showing an example of a variety of waveforms at the time when the step-up transistor Q1 is turned on. FIG. 10 is illustrated in a similar way to FIG. 9. Note that the waveforms in FIGS. 9 and 10 are examples of simulation results.

<On-State (i) in Transistor Q1 (See FIG. 3)>

Figure 4:
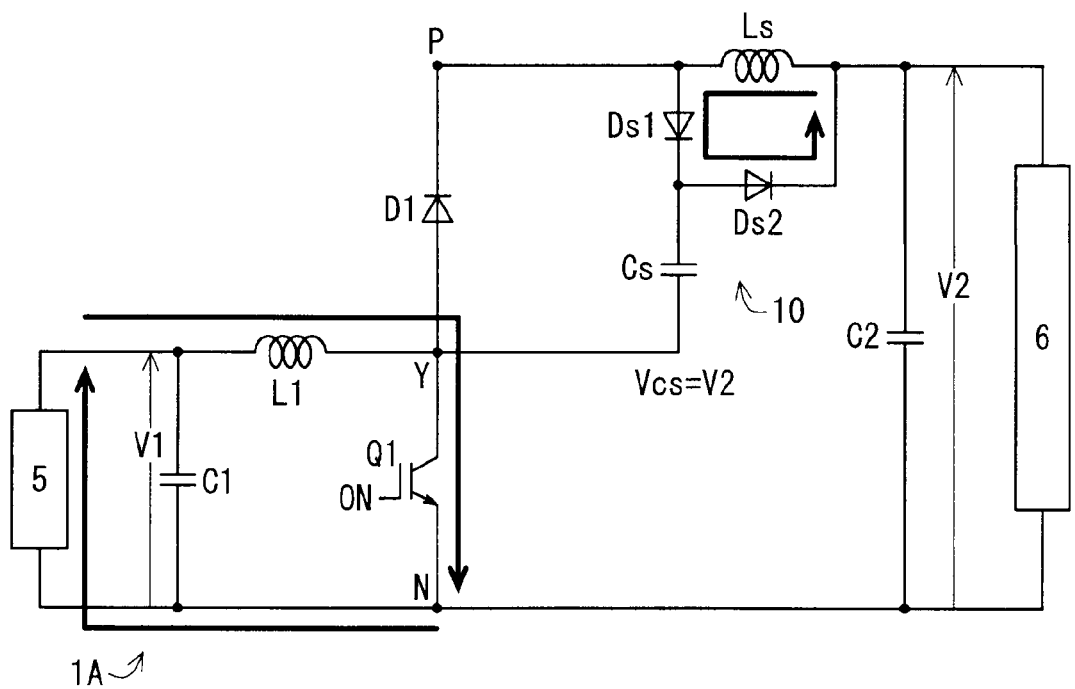
FIGS. 4 to 8 are diagrams each schematically showing the step-up operation of the DC-DC converter according to the first preferred embodiment.

As shown in FIG. 4, the current flows through a path from the positive electrode of the DC power supply 5 through the main reactor L1 and the transistor Q1 to the negative electrode of the DC power supply 5. In such a way, the main reactor L1 stores energy.

Moreover, in the on-state (i), the snubber capacitor Cs is fully charged through the snubber reactor Ls and the first snubber diode Ds1 by the voltage V2 on the high voltage-side connection ends.

<Transient State (ii) from On-State to Off-State in Transistor Q1 (See FIG. 3)>

Figure 5:
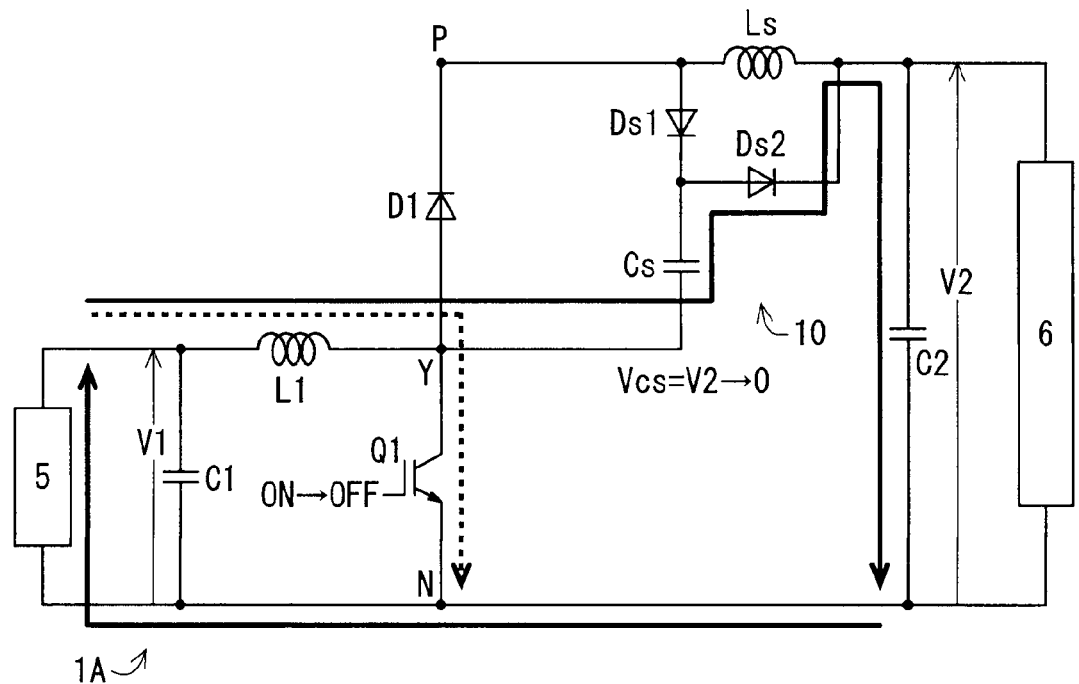

As shown in FIG. 5, the current flowing through the main reactor L1 passes through the snubber capacitor Cs, the second snubber diode Ds2, and the high voltage-side capacitor C2. Here, in the case of the hard switching in which the snubber circuit 10 is not provided, the current flows through a path passing through the diode D1. As opposed to this, in the case of the converter 1A in which the snubber circuit 10 is provided, the snubber capacitor Cs works as a low-impedance path, and accordingly, the current flows through the above-described path.

In the transient state (ii), while the current Ic of the transistor Q1 is turned off, the snubber capacitor Cs is discharged, and accordingly, the voltage Vce of the transistor Q1 is gradually increased (see FIG. 3 and the lower stage of FIG. 9). In such a way, such a turn-off loss Poff (which is correlated with an area of an overlap portion of the current Ic and the voltage Vce in the graph on the lower stage of FIG. 9) is reduced. In accordance with the graph on the upper stage of FIG. 9, it is understood that the turn-off loss Poff is reduced to a large extent in the soft switching by the converter 1A in comparison with the hard switching.

Thus, when the transistor Q1 is turned off, the high voltage-side capacitor C2 is charged from the snubber capacitor Cs through the second snubber diode Ds2, and accordingly, a rise of the voltage Vce can be made gentle. That is, the soft switching is realized. In accordance with such soft switching, it is possible to reduce switching energy to one several-th or less of that of the hard switching.

<Off-State (iii) in Transistor Q1 (See FIG. 3)>

Figure 6:
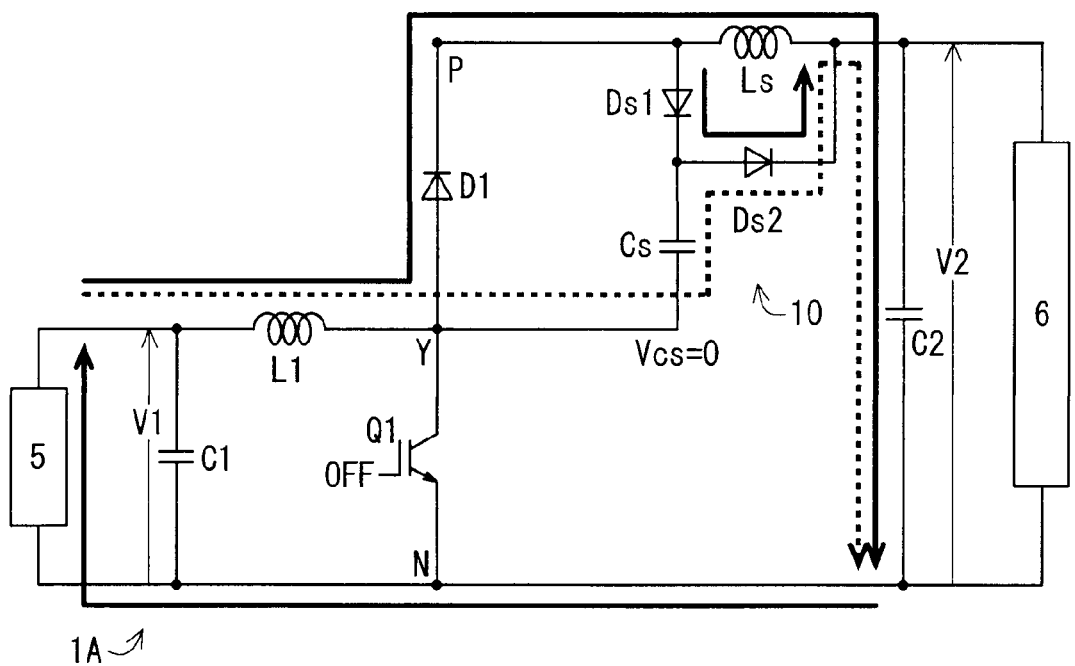

After the discharge of the snubber capacitor Cs, as shown in FIG. 6, the current flowing through the main reactor L1 passes through the diode D1, the first snubber diode Ds1, and the second snubber diode Ds2 to the high voltage-side capacitor C2. Note that, in the case of adopting diodes with a specification of fast recovery, each of which has a high forward voltage drop (VF), for the snubber diodes Ds1 and Ds2, the current flowing through the main reactor L1 mainly flows to the diode D1 and the snubber reactor Ls.

<Transient State (iv) from Off-State to On-State in Transistor Q1 (See FIG. 3)>

Figure 7:
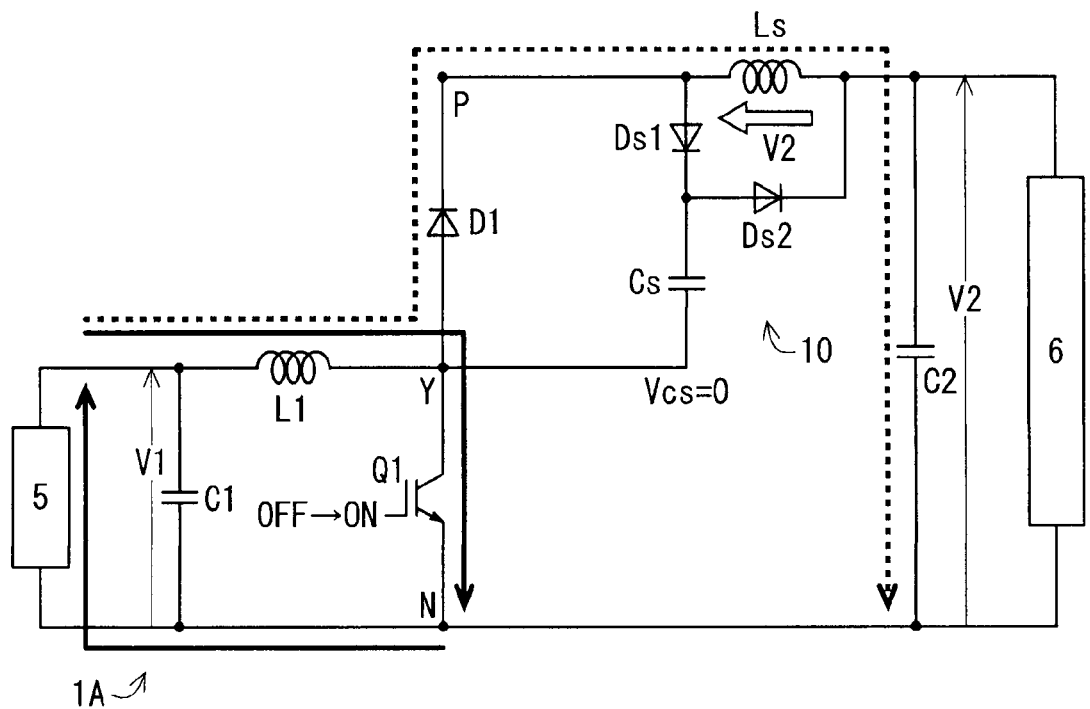

As shown in FIG. 7, when the current flowing though the main reactor L1 shifts from the diode D1 to the transistor Q1, a change occurs in the current flowing through the snubber reactor Ls. Owing to the current change of the snubber reactor Ls and to a situation where the snubber capacitor Cs is in a discharged state at this point of time, the voltage Vce of the transistor Q1 drops to an extremely low level immediately after the current Ic of the transistor Q1 starts to flow (by an effect of V=Ls×di/dt, in other words, by generation of counter electromotive force by self-induction).

Figure 8:
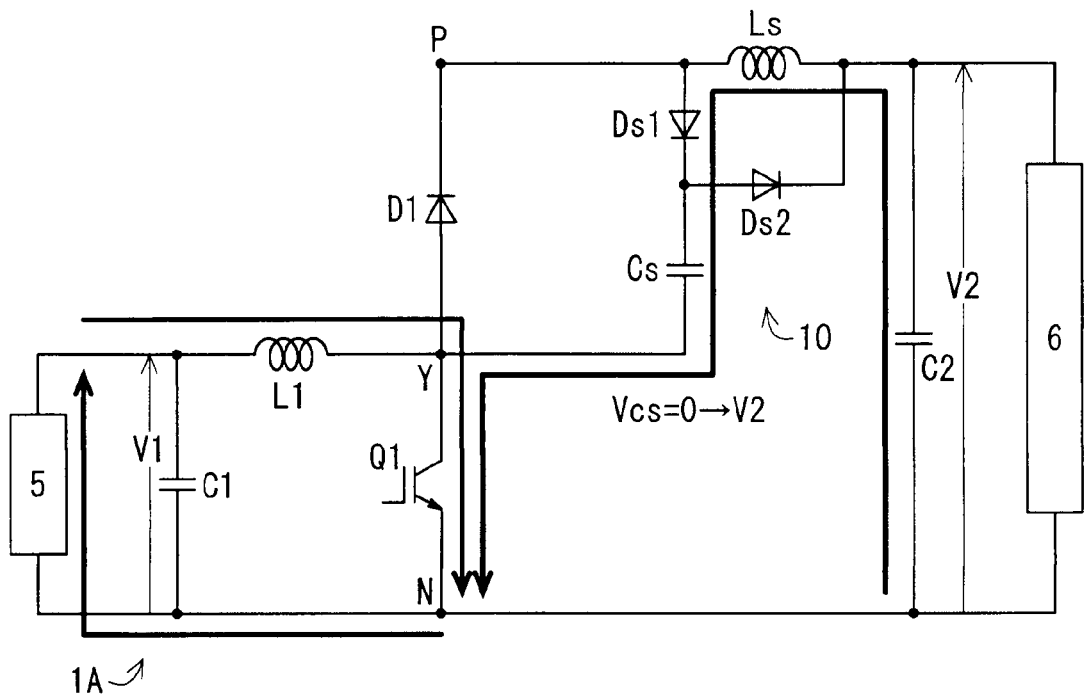

Then, as shown in FIG. 8, the current starts to flow from the side of the high voltage-side connection ends, in other words, from the high voltage-side capacitor C2 through the snubber reactor Ls and the first snubber diode Ds1, whereby the snubber capacitor Cs is charged.

Hence, unlike the hard switching in which the voltage Vce of the transistor Q1 stays at the voltage V2 on the high voltage-side connection ends until a reverse recovery stage of the diode D1, in accordance with the soft switching by the snubber circuit 10, a turn-on loss Pon (which is correlated with an area of an overlap portion of the current Ic and the voltage Vce in the graph on the lower stage of FIG. 10) is reduced. In accordance with the graph on the upper stage of FIG. 10, it is understood that the turn-on loss Pon is reduced to a large extent in the soft switching by the converter 1A in comparison with the hard switching.

Figure 11:
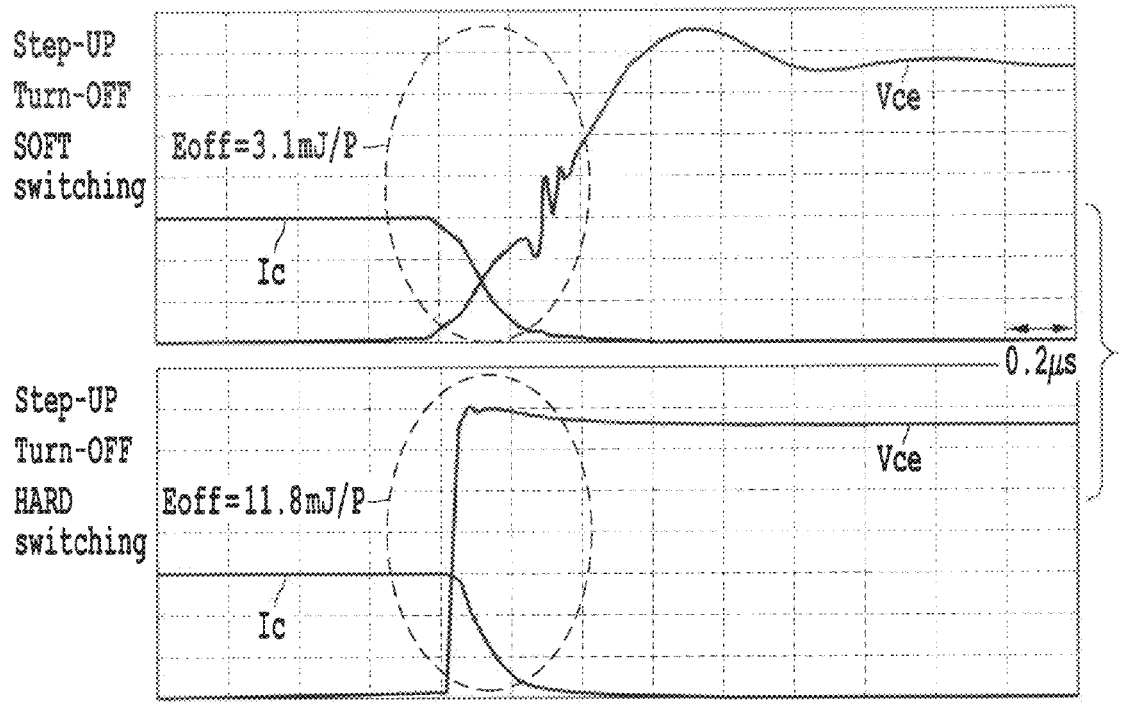
FIG. 11 is a waveform chart showing another example of the variety of waveforms in the step-up operation of the DC-DC converter according to the first preferred embodiment (turn off)
Figure 12:
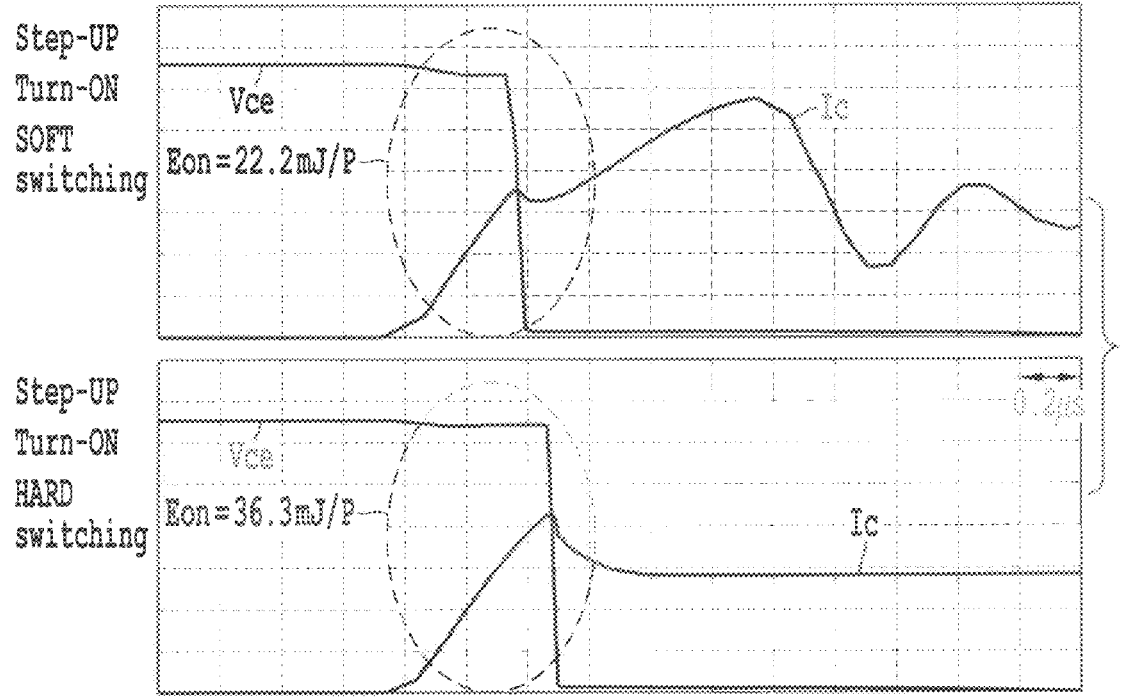
FIG. 12 is a waveform chart showing another example of the variety of waveforms in the step-up operation of the DC-DC converter according to the first preferred embodiment (turn on)

Note that, in FIGS. 11 and 12, other waveform examples (simulations) are illustrated. FIG. 11 is another example of the variety of waveforms at the time when the step-up transistor Q1 is turned off. An upper stage of FIG. 11 shows the case of the soft switching made by adopting the snubber circuit 10, and a lower stage of FIG. 11 shows the case of the hard switching made by not adopting the snubber circuit 10. Moreover, FIG. 12 is another example of the variety of waveforms at the time when the transistor Q1 is turned on, and is illustrated in a similar way to FIG. 11. Note that the reason why the waveforms of the soft switching in FIGS. 11 and 12 are different from those in FIGS. 9 and 10 is that constants and the like of such a variety of elements of the converter 1A are changed.

<Effects>

As described above, in accordance with the converter 1A, not only the turn-off loss but also the turn-on loss can be reduced in the step-up operation. In accordance with the example in FIGS. 11 and 12, a reduction effect approximate to 50% can be confirmed in the sum of the turn-off loss and the turn-on loss.

Note that, in Japanese Patent Application Laid-Open No. 2004-201369, it is conceived that a zero-voltage switching auxiliary circuit corresponds to the snubber circuit 10 of the converter 1A; however, both of the circuits are completely different in arrangement position from each other.

Moreover, in accordance with the converter 1A, the efficiency enhancement and downsizing of the device can be achieved following the reduction of the switching loss even if the switching frequency is increased. That is, it becomes possible to simultaneously advance the increase of the frequency, the efficiency enhancement, and the downsizing.

Moreover, an occurrence of electromagnetic noise can be suppressed by the soft switching.

Moreover, the number of parts in the snubber circuit 10 is small. Accordingly, even if the snubber circuit 10 is adopted, it is possible to suppress significant upsizing and cost increase, and further, reduction of the efficiency, which may be caused by the upsizing.

Moreover, the snubber circuit 10 does not require complicated control for itself, and accordingly, can easily realize the soft switching.

Second Preferred Embodiment

FIG. 13 shows a circuit diagram schematically showing a configuration of a converter 1B according to a second preferred embodiment. The converter 1B is a so-called bidirectional step-up/down (also referred to as bidirectional) converter. That is, the converter 1B has a configuration capable of executing both of the step-up operation (the voltage V1 on the low voltage-side connection ends is stepped up to the voltage V2, and the stepped-up voltage V2 is outputted to the high voltage-side connection ends) and a step-down operation (the voltage V2 on the high voltage-side connection ends is stepped down to the voltage V1, and the stepped-down voltage V1 is outputted to the low voltage-side connection ends). In other words, in the step-up operation, the converter 1B steps up the voltage V1, which is applied by the low voltage-side device 5, to the voltage V2, and supplies the stepped-up voltage V2 to the high voltage-side device 6. On the other hand, in the step-down operation, the converter 1B steps down the voltage V2, which is applied to the high voltage-side device 6, to the voltage V1, and supplies the stepped-down voltage V1 to the low voltage-side device 5.

Note that the low voltage-side connection ends called the input side or the primary side in the step-up operation correspond to the output side or the secondary side in the step-down operation. Moreover, the high voltage-side connection ends called the output side or the secondary side in the step-up operation correspond to the input side or the primary side in the step-down operation.

In the second preferred embodiment, the case where the low voltage-side device 5 is the DC power supply, and in particular, a rechargeable battery (also referred to as a secondary battery) is illustrated, and the low voltage-side device 5 is also referred to as a rechargeable battery 5. Moreover, the case where the high voltage-side device 6 is a device including an inverter connected to the converter 1B and a motor generator connected to the inverter is illustrated, and the high voltage-side device 6 is also referred to as an inverter/motor generator 6. Such an illustrated configuration is mounted on a vehicle, for example, such as an electric train, an electric car, and a hybrid car.

In accordance with this illustrated configuration, a DC voltage outputted from the rechargeable battery 5 is stepped up by the converter 1B, is converted into an alternating current (AC) voltage by the inverter, and then, the motor generator, as a motor, is rotated. In such a way, wheels connected to the motor generator rotate, and the vehicle runs with power.

As opposed to this, at the time of vehicle braking, the motor generator works as a generator. Therefore, an AC voltage generated by the motor generator is converted into a DC voltage by the inverter, is stepped down by the converter 1B and is charged to the rechargeable battery 5. That is, the power is regenerated from the motor generator.

Note that the case is illustrated below, where the converter 1B is composed as a power device in a similar way to the first preferred embodiment; however, an application field of the converter 1B is not limited to this.

<Configuration of Converter 1B>

The converter 1B illustrated in FIG. 13 has a configuration in which a switching element Q2 is added to the converter 1A illustrated in FIG. 1. Other configurations of the converter 1B are basically similar to those of the converter 1A.

The switching element Q2 has a current input end, a current output end, and a control end. The current input end is connected to the cathode of the diode D1, the anode of the first snubber diode Ds1, and the above-described one end of the snubber reactor Ls. The current output end is connected to the anode of the diode D1, the above-described other end of the main reactor L1, the current input end of the switching element Q1 (that is, the collector of the transistor Q1), and the cathode of the diode D2. Note that the switching element Q2 is connected in anti-parallel to the diode D1. The control end is connected to the control device 20, and receives, from the control device 20, a control signal S22 for controlling on/off between the current input end and the current output end. Note that the switching element Q2 is sometimes also referred to below as a step-down switching element Q2.

Here, the case where the step-down switching element Q2 is composed of an IGBT is illustrated, and the switching element Q2 is also referred to as a transistor Q2. Moreover, the current input end, current output end, and control end of the switching element Q2 are allowed to correspond to terminals of the IGBT, and are sometimes also referred to as a collector, an emitter, and a gate, respectively. Furthermore, it is also possible to adopt other power semiconductor switching elements as the step-down switching element Q2.

Note that the diode D2 is sometimes also referred to below as a step-down diode D2, and that the diode D1 is sometimes also referred to below as a step-up diode D1.

By the addition of the step-down transistor Q2, the control device 20 also functions as a means that controls operations of the step-down transistor Q2. More specifically, this means controls voltage application to the gate of the transistor Q2, and thereby controls on/off of the transistor Q2. In this case, a gate voltage outputted from this means corresponds to the switching control signal S22 of the transistor Q2. For example, the control signal S22 has a similar waveform to that of the control signal S21 in FIG. 2.

<Step-Up Operation of Converter 1B>

The converter 1B is driven in a similar way to the converter 1A (see FIG. 1) in a state where the step-down transistor Q2 is off, whereby it is possible to allow the converter 1B to perform the step-up operation. Therefore, the step-up operation of the converter 1B is describe with reference to the description in the first preferred embodiment, and here, a repeated description is omitted.

<Step-Down Operation of Converter 1B>

The step-down transistor Q2 is driven in a state where the step-up transistor Q1 is off, whereby it is possible to allow the converter 1B to perform the step-down operation. A description is made below of the step-down operation of the converter 1B with reference also to FIGS. 14 to 21.

Figure 14:
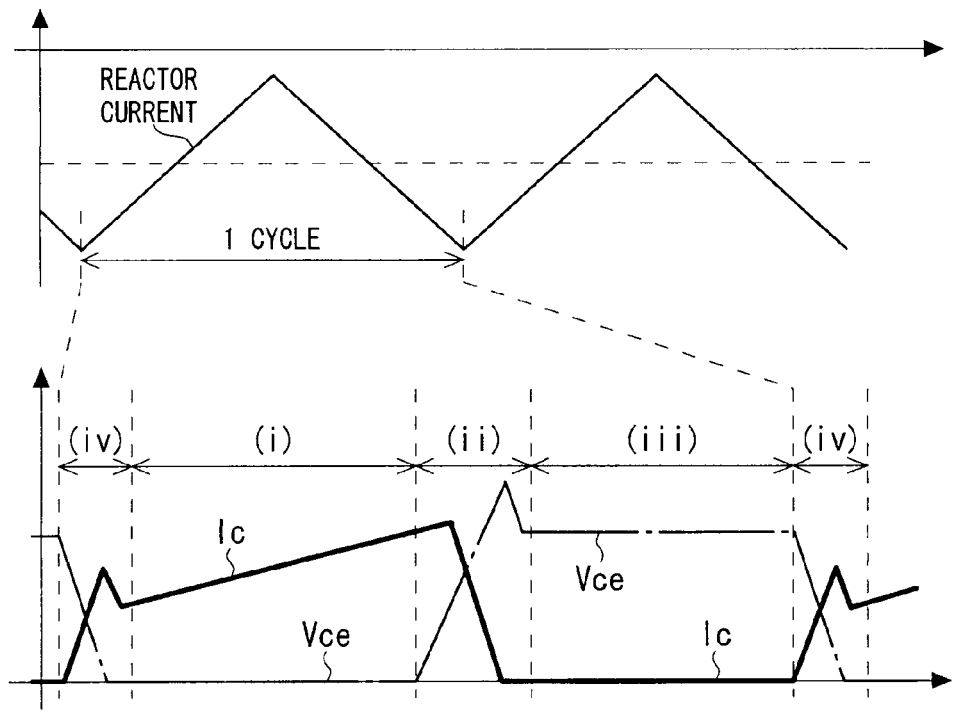
FIG. 14 is a waveform chart schematically showing a variety of waveforms in a step-down operation of the DC-DC converter according to the second preferred embodiment.

FIG. 14 is a waveform chart schematically showing a variety of waveforms in the step-down operation. An upper stage of FIG. 14 shows a schematic waveform of a current (reactor current) flowing though the main reactor L1, and a lower stage of FIG. 14 shows schematic waveforms of a collector current Ic of the step-down transistor Q2 and a voltage Vce between the collector and emitter thereof.

FIGS. 15 to 19 schematically show flows of the current at a variety of timing in the step-down operation. Circuit diagrams in FIGS. 15 to 19 are basically the same as in FIG. 13; however, illustration of the control device 20, the step-up transistor Q1, and the step-up diode D1 is omitted therefrom.

Figure 20:
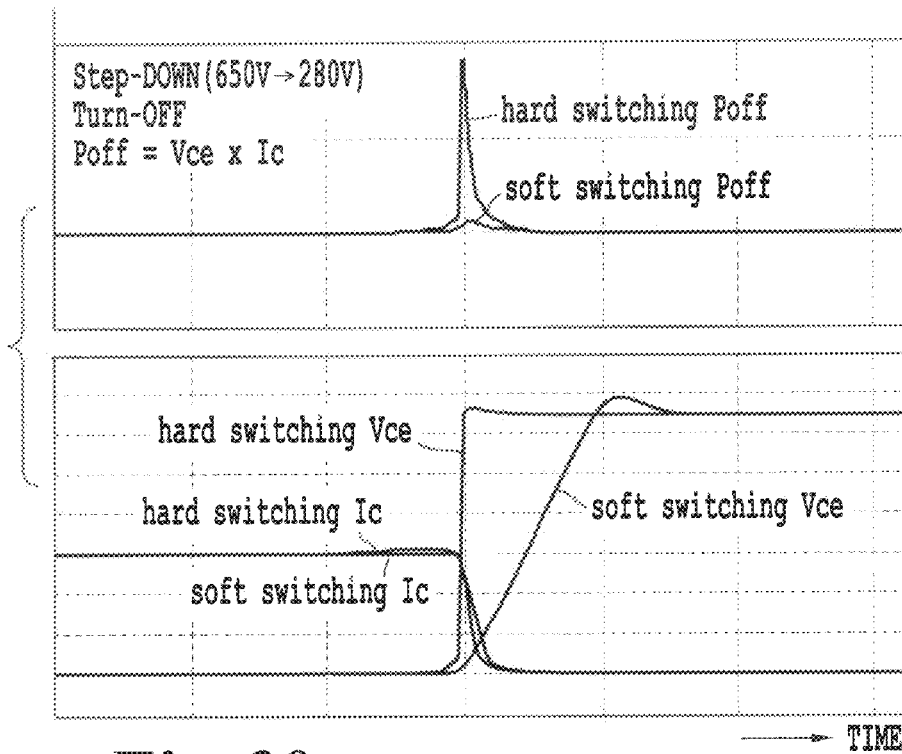
FIG. 20 is a waveform chart showing an example of the variety of waveforms in the step-down operation of the DC-DC converter according to the second preferred embodiment (turn off)
Figure 21:
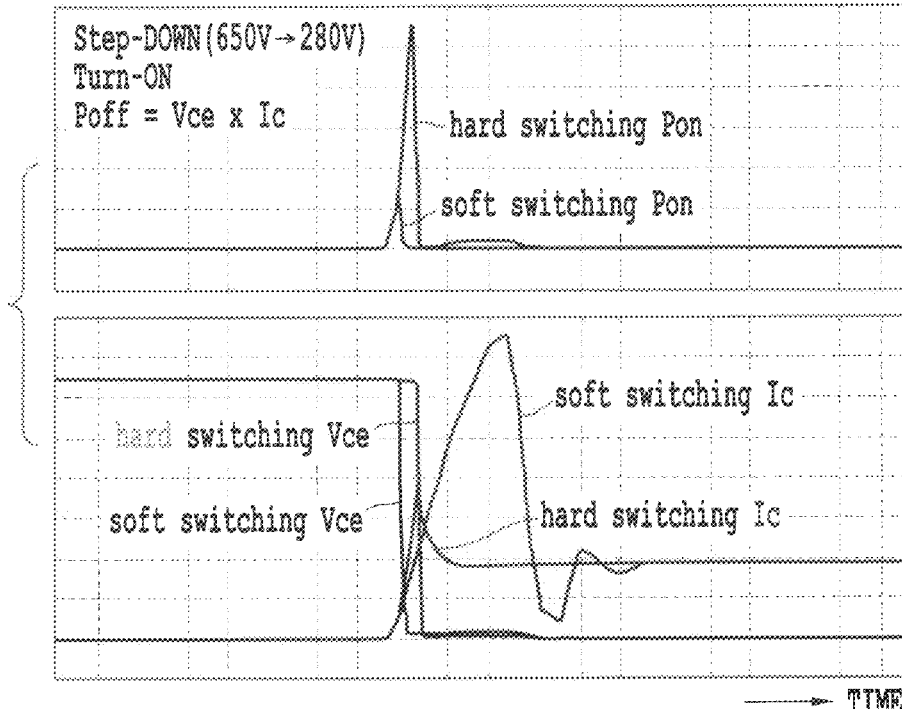
FIG. 21 is a waveform chart showing an example of the variety of waveforms in the step-down operation of the DC-DC converter according to the second preferred embodiment (turn on)

FIG. 20 is a waveform chart showing an example of a variety of waveforms at the time when the step-down transistor Q2 is turned off. FIG. 21 is a waveform chart showing an example of a variety of waveforms at the time when the step-down transistor Q2 is turned on. FIGS. 20 and 21 are illustrated in a similar way to FIGS. 9 and 10, which are already shown.

<On-State (i) in Transistor Q2 (See FIG. 14)>

Figure 15:
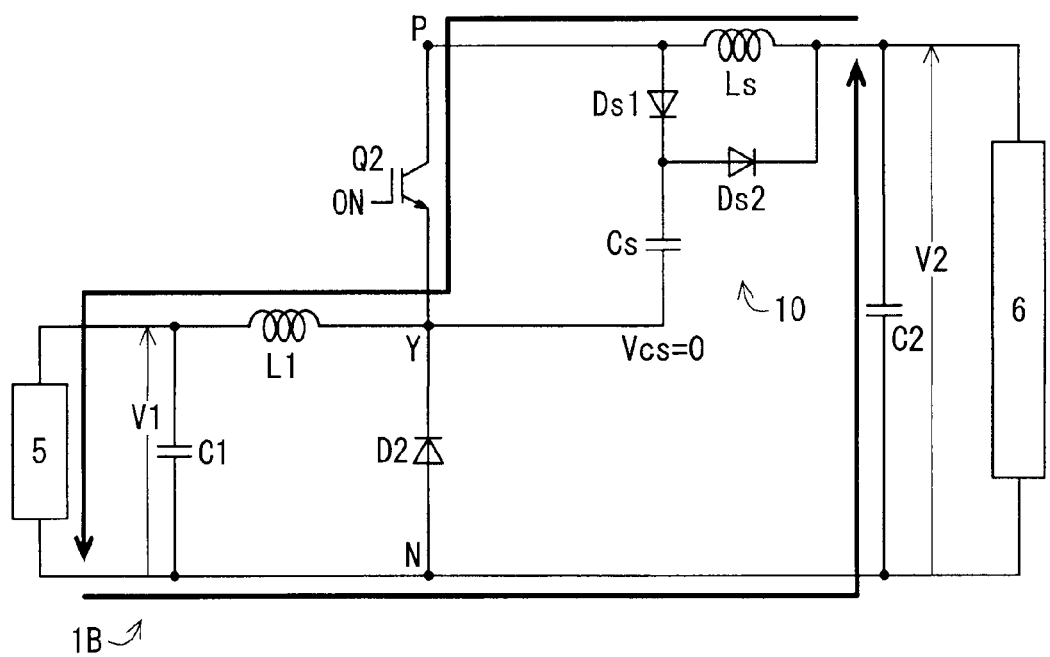
FIGS. 15 to 19 are diagrams each schematically showing the step-down operation of the DC-DC converter according to the second preferred embodiment.

As shown in FIG. 15, the current flows through a path from the inverter/motor generator 6 (in other words, from the high voltage-side capacitor C2) through the snubber reactor Ls, the step-down transistor Q2, and the main reactor L1 to a positive electrode of the rechargeable battery 5. In such a way, the main reactor L1 stores energy.

Moreover, in the on-state (i), the snubber capacitor Cs discharges through the snubber reactor Ls and the second snubber diode Ds2.

<Transient State (ii) from On-State to Off-State in Transistor Q2 (See FIG. 14)>

Figure 16:
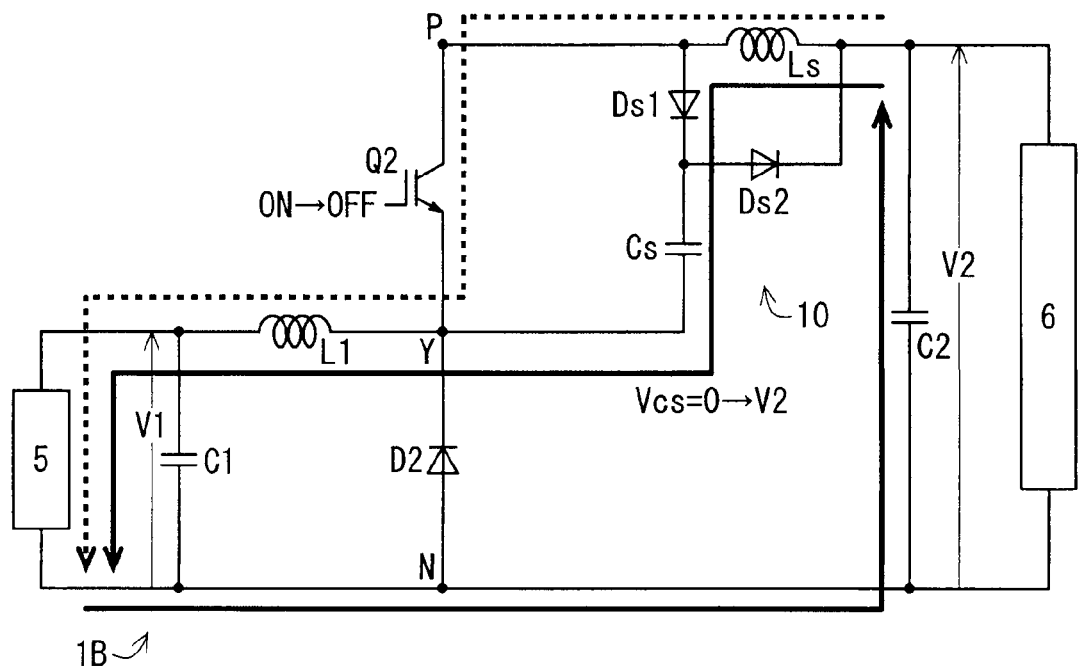

As shown in FIG. 16, the current flowing through the main reactor L1 and the snubber reactor Ls passes through the first snubber diode Ds1 and the snubber capacitor Cs. Here, in the case of the hard switching in which the snubber circuit 10 is not provided, the current flows through a path passing through the step-down diode D2. As opposed to this, in the case of the converter 1B in which the snubber circuit 10 is provided, the snubber capacitor Cs is charged to the voltage V2 on the high voltage-side connection ends before the step-down diode D2 becomes a conduction state, and accordingly, the current flows through the above-described path.

In the transient state (ii), while the current Ic of the transistor Q2 is turned off, the snubber capacitor Cs is charged, and accordingly, the voltage Vce of the transistor Q2 is gradually increased (see FIG. 14 and the lower stage of FIG. 20). In such a way, such a turn-off loss Poff (which is correlated with an area of an overlap portion of the current Ic and the voltage Vce in the graph on the lower stage of FIG. 20) is reduced. In accordance with the graph on the upper stage of FIG. 20, it is understood that the turn-off loss Poff is reduced to a large extent in the soft switching by the converter 1B in comparison with the hard switching.

<Off-State (iii) in Transistor Q2 (See FIG. 14)>

Figure 17:
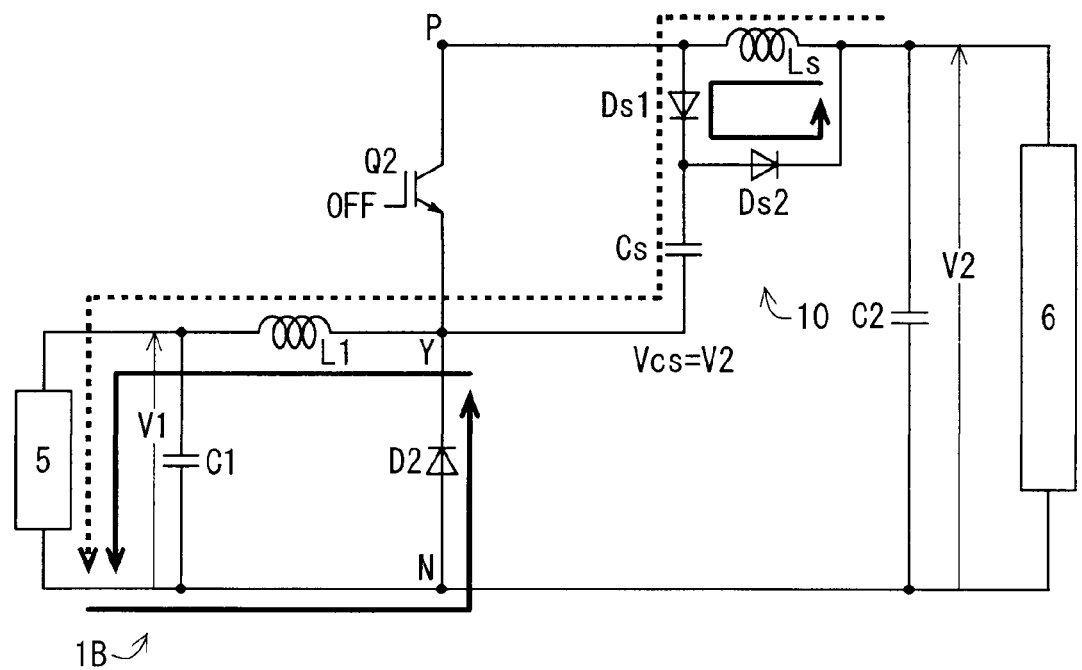

After the charge of the snubber capacitor Cs, as shown in FIG. 17, the current flowing through the main reactor L1 continues to flow to the rechargeable battery 5 (in other words, to the side of the low voltage-side connection ends) through the step-down diode D2.

The energy stored in the main rector L1 during the charge of the snubber capacitor Cs circulates the current through a path passing through the snubber reactor Ls, the first snubber diode Ds1 and the second snubber diode Ds2.

<Transient State (iv) from Off-State to On-State in Transistor Q2 (See FIG. 14)>

Figure 18:
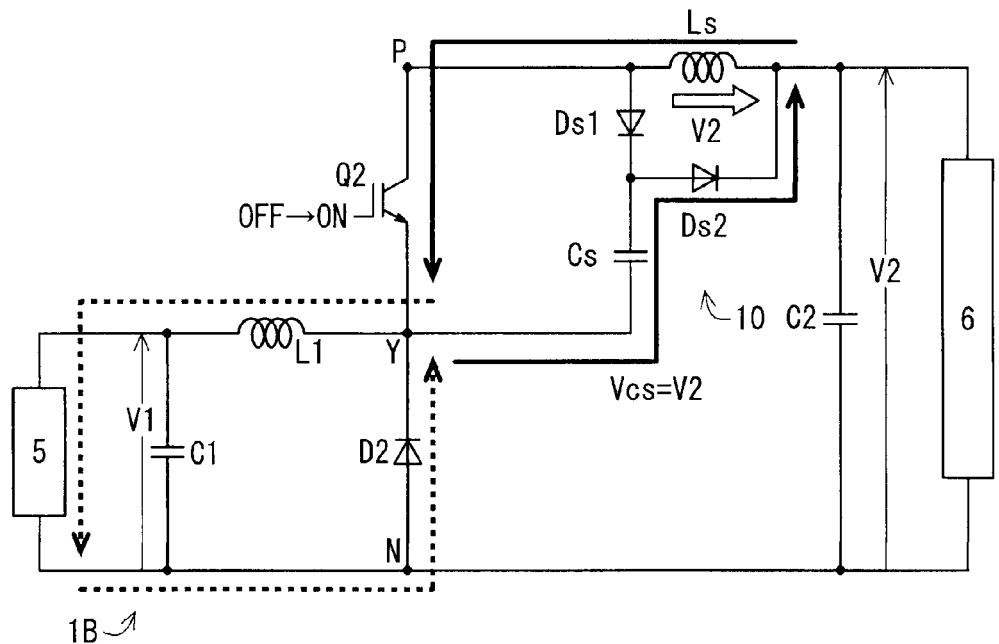

As shown in FIG. 18, when the current flowing though the main reactor L1 shifts from the diode D2 to the transistor Q2, a change occurs in the current flowing through the snubber reactor Ls. Owing to the current change of the snubber reactor Ls and to a situation where the snubber capacitor Cs is in a charged state at this point of time, the voltage Vce of the transistor Q2 drops to an extremely low level immediately after the current Ic of the transistor Q2 starts to flow (by an effect of V=Ls×di/dt, in other words, by generation of counter electromotive force by self-induction).

Figure 19:
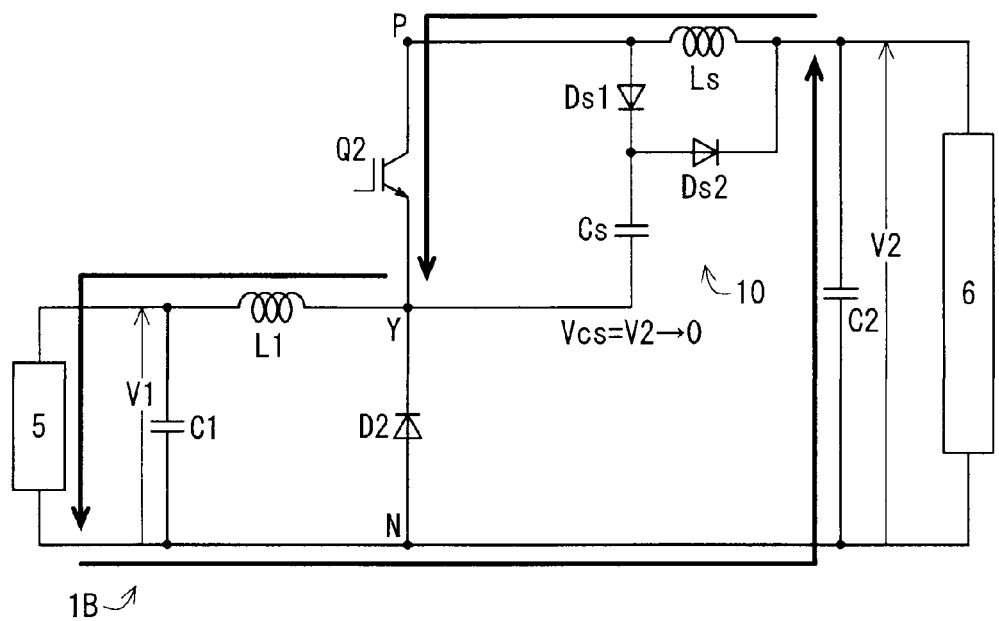

Then, as shown in FIG. 19, the current starts to flow from the fully charged snubber capacitor Cs through the snubber reactor Ls and the second snubber diode Ds2, whereby the snubber capacitor Cs is discharged.

Hence, unlike the hard switching in which the voltage Vce of the transistor Q2 stays at the voltage V2 on the high voltage-side connection ends until a reverse recovery stage of the diode D2, in accordance with the soft switching by the snubber circuit 10, a turn-on loss Pon (which is correlated with an area of an overlap portion of the current Ic and the voltage Vice in the graph on the lower stage of FIG. 21) is reduced. In accordance with the graph on the upper stage of FIG. 21, it is understood that the turn-on loss Pon is reduced to a large extent in the soft switching by the converter 1B in comparison with the hard switching.

Figure 22:
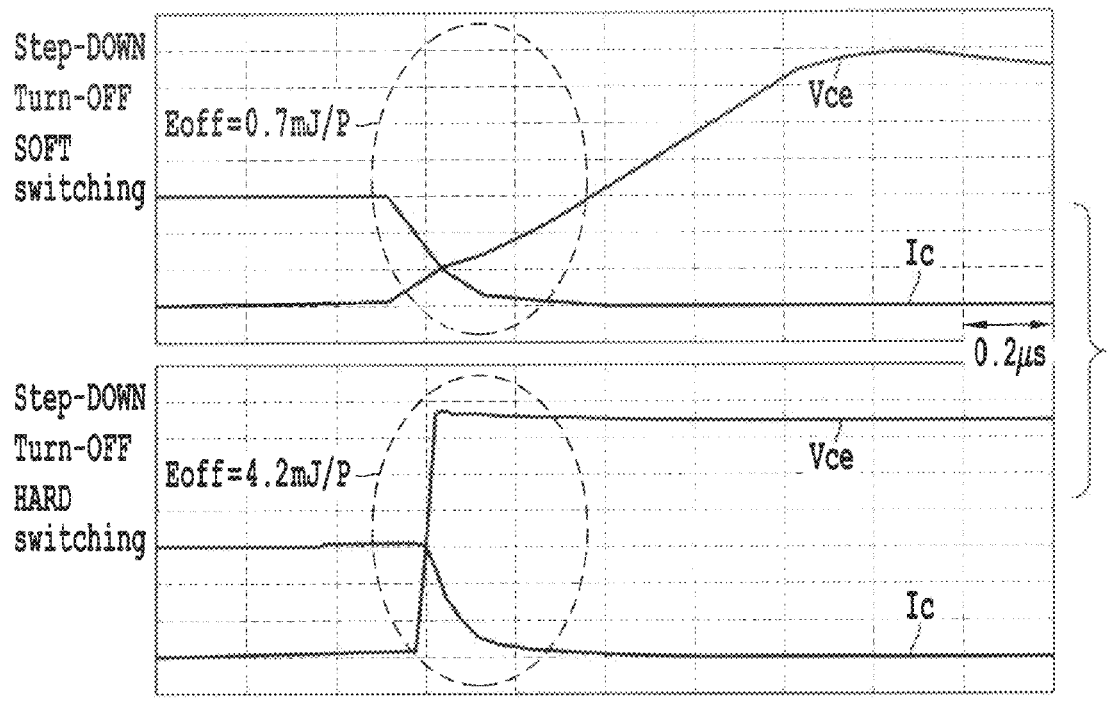
FIG. 22 is a waveform chart showing another example of the variety of waveforms in the step-down operation of the DC-DC converter according to the second preferred embodiment (turn off)
Figure 23:
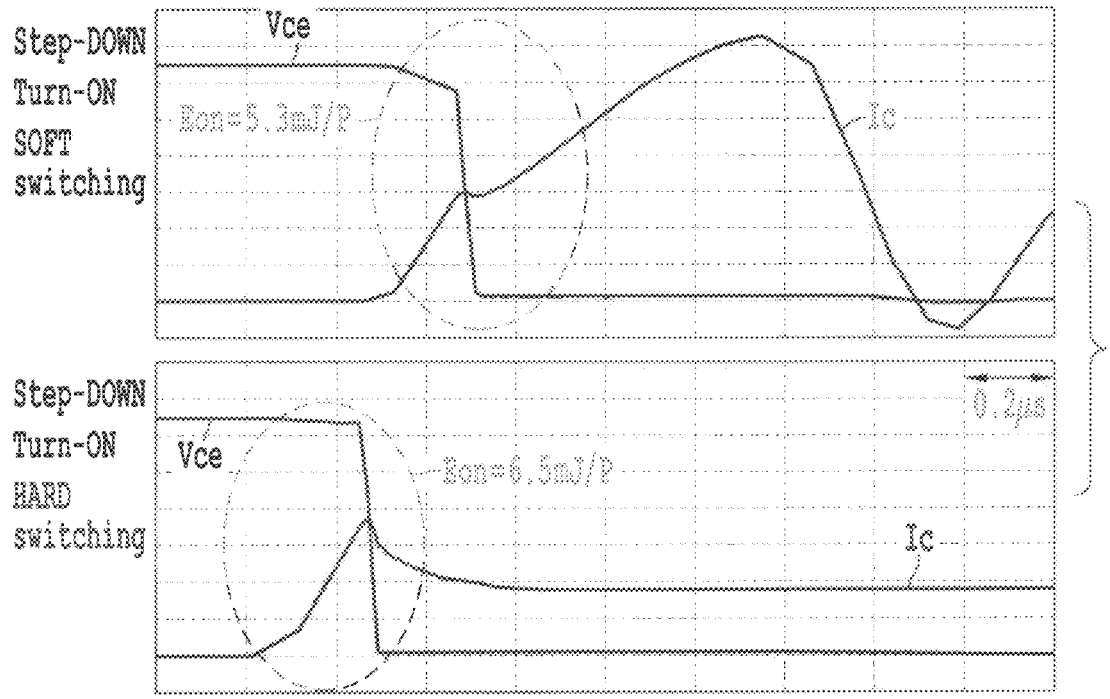
FIG. 23 is a waveform chart showing another example of the variety of waveforms in the step-down operation of the DC-DC converter according to the second preferred embodiment (turn on)

Note that, in FIGS. 22 and 23, other waveform examples (simulations) are illustrated. FIG. 22 is another example of the variety of waveforms at the time when the step-down transistor Q2 is turned off, and FIG. 23 is another example of the variety of waveforms at the time when the step-down transistor Q2 is turned on. FIGS. 22 and 23 are illustrated in a similar way to FIGS. 11 and 12, which are already shown. Note that the reason why the waveforms of the soft switching in FIGS. 22 and 23 are different from those in FIGS. 20 and 21 is that constants and the like of such a variety of elements of the converter 1B are changed.

<Effects>

In accordance with the converter 1B, both of the turn-off loss and the turn-on loss can be reduced not only in the step-up operation but also in the step-down operation. In accordance with the example in FIGS. 22 and 23, a reduction effect approximate to 40% can be confirmed in the sum of the turn-off loss and the turn-on loss. Moreover, in accordance with the converter 1B, other effects exerted by the above-mentioned converter 1A can also be obtained.

Third Preferred Embodiment

Figure 24:
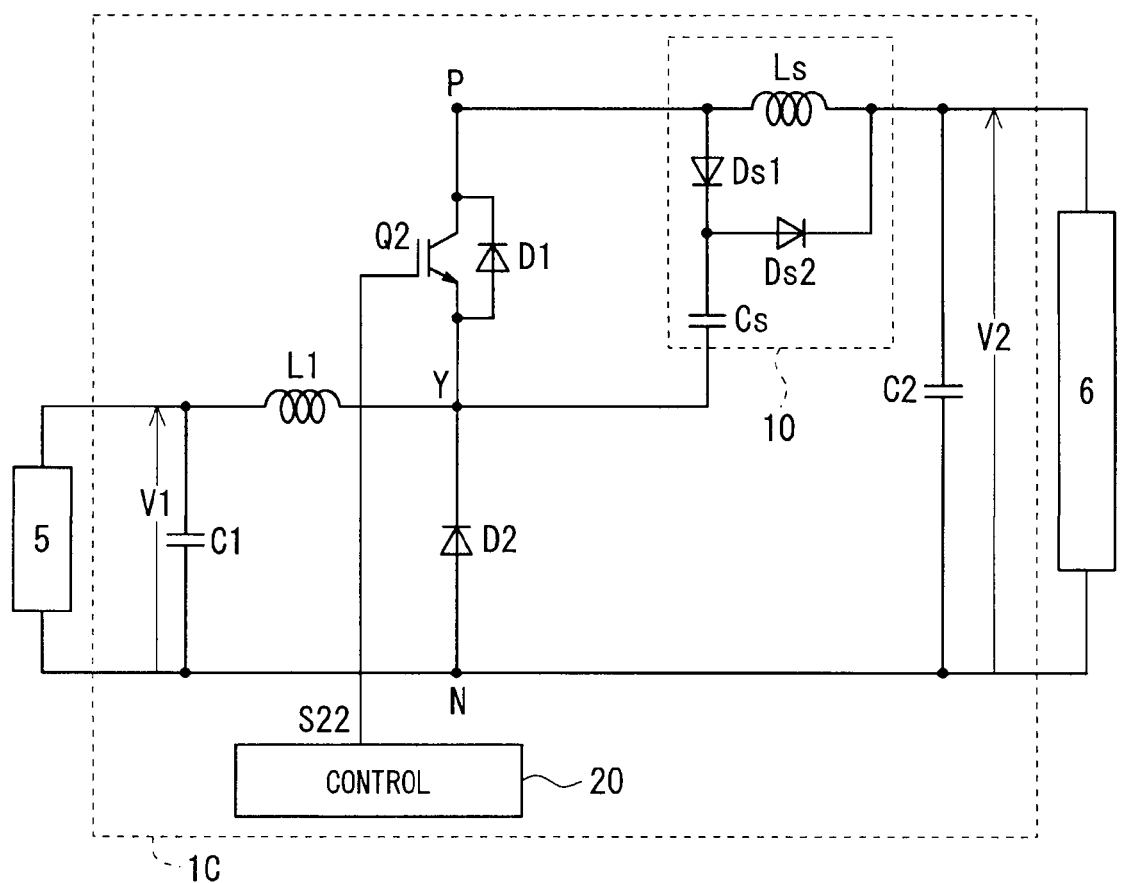
FIG. 24 is a circuit diagram schematically showing a configuration of a DC-DC converter according to a third preferred embodiment.

FIG. 24 shows a circuit diagram schematically showing a configuration of a converter 1C according to a third preferred embodiment. The converter 1C illustrated in FIG. 24 has a configuration in which the step-up transistor Q1 is removed from the bidirectional step-up/down converter 1B (see FIG. 13) according to the second preferred embodiment. That is, the converter 1C is tailored to be step-down. Other configurations of the converter 1C are basically similar to those of the converter 1B. Note that, from a viewpoint of the step-down operation, it is also possible to omit the step-up diode D1.

Note that, in the third preferred embodiment, the case is illustrated, where the low voltage-side device 5 is a variety of loads or a rechargeable battery, and the high voltage-side device 6 is a DC power supply (which may be a device in which an AC generator and an inverter are combined with each other, and the like).

In accordance with the converter 1C, in the step-down operation, both of the turn-off loss and the turn-on loss can be reduced. Moreover, in accordance with the converter 1C, other effects exerted by the above-mentioned converter 1B can also be obtained.

Fourth Preferred Embodiment

Figure 25:
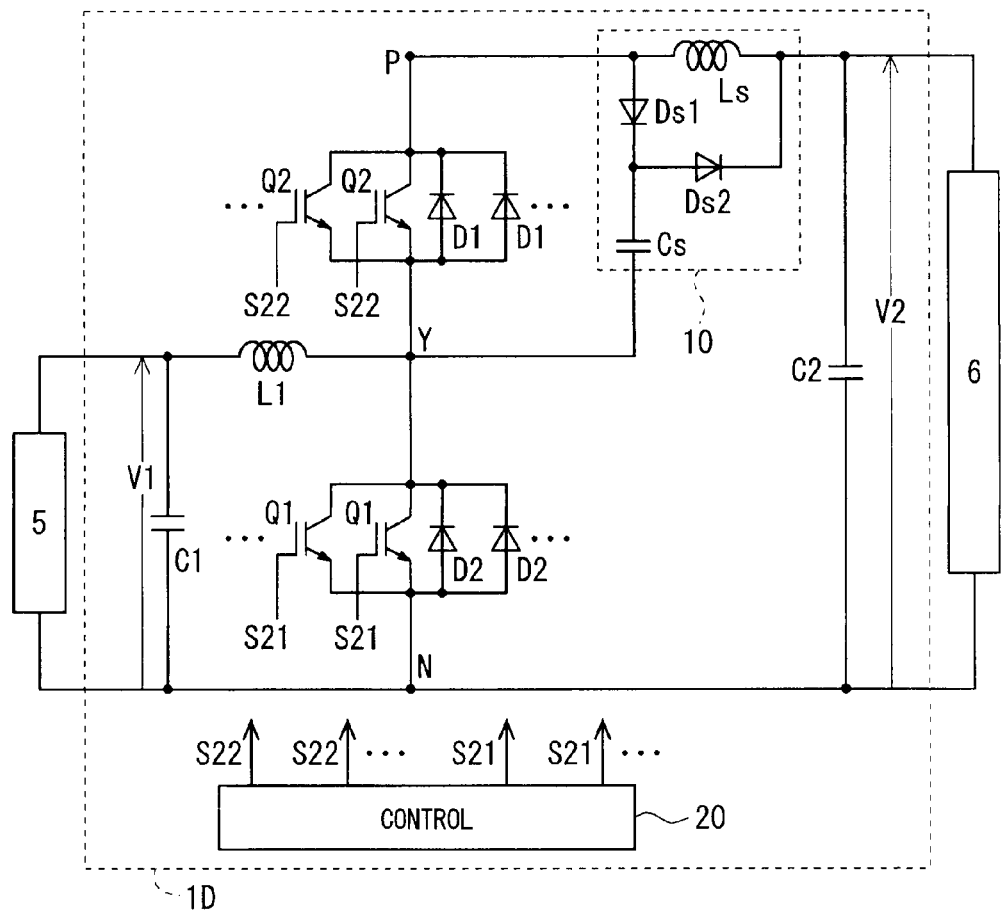
FIG. 25 is a circuit diagram schematically showing a configuration of a DC-DC converter according to a fourth preferred embodiment.

FIG. 25 shows a circuit diagram schematically showing a configuration of a converter 1D according to a fourth preferred embodiment. The converter 1D illustrated in FIG. 25 has a configuration, in which a plurality of the transistors Q1, a plurality of the transistors Q2, a plurality of the diodes D1 and a plurality of the diodes D2 are provided, in the bidirectional step-up/down converter 1B (see FIG. 13) according to the second preferred embodiment. Other configurations of the converter 1D are basically similar to those of the converter 1B.

More specifically, the plurality of step-up transistors Q1 are connected in parallel to one another in the same orientation, and with regard to each of the transistors Q1, a current input end thereof is connected to the above-described other end of the main rector L1, and a current output end thereof is connected to the point of the ground potential N.

Moreover, the plurality of step-down transistors Q2 are connected in parallel to one another in the same orientation, and with regard to each of the transistors Q2, a current input end thereof is connected to the above-described one end of the snubber reactor Ls and the anode of the first snubber diode Ds1, and a current output end thereof is connected to the above-described other end of the main reactor L1.

Moreover, the plurality of step-up diodes D1 are connected in parallel to one another in the same orientation, and are connected in anti-parallel to the plurality of step-down transistors Q2.

Moreover, the plurality of step-down diodes D2 are connected in parallel to one another in the same orientation, and are connected in anti-parallel to the plurality of step-up transistors Q1.

Here, an element capacity (in other words, element performance) of each of the transistors Q1 of the converter 1D is set smaller than an element capacity of the single transistor Q1 of the converter 1B (see FIG. 13). For example, the element capacity of each of the transistors Q1 of the converter 1D is set approximately at a value obtained by equally dividing the element capacity of the single transistor Q1 of the converter 1B. Such a point also applies to the transistors Q2 and the diodes D1 and D2.

In response to the number of transistors Q1 and Q2, the control device 20 controls operations of these transistors Q1 and Q2. More specifically, in the step-up operation, the control device 20 functions as a means that performs control to turn off all of the step-down transistors Q2, and control to sequentially turn on the plurality of step-up transistors Q1 while shifting timing thereamong. On the other hand, in the step-down operation, the control device 20 functions as a means that performs control to turn off all of the step-up transistors Q1, and control to sequentially turn on the plurality of step-down transistors Q2 while shifting timing thereamong.

Figure 26:
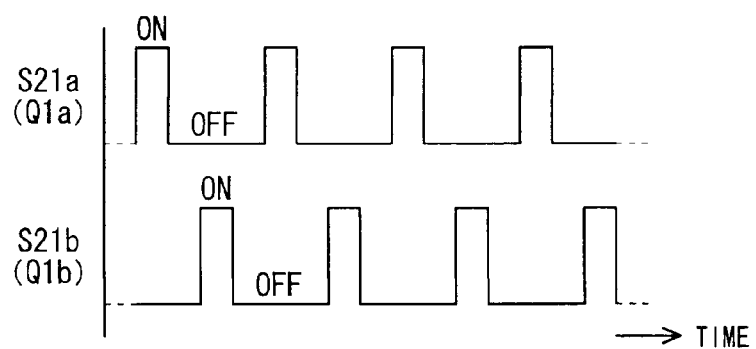
FIG. 26 is a waveform chart schematically showing switching of the DC-DC converter according to the fourth preferred embodiment.

FIG. 26 shows a waveform chart of switching control signals S21 of the step-up transistors Q1, in other words, a waveform chart schematically showing operations of the transistors Q1. In FIG. 26, the case is illustrated, where two step-up transistors Q1 (distinguished from each other by reference symbols Q1a and Q1b) are provided, a control signal S21a is used as the control signal S21 for the transistor Q1a, and a control signal S21b is used as the control signal S21 for the transistor Q1b. As shown in FIG. 26, between the control signals S21a and S21b, timing of on-periods is shifted, and in the step-up operation, it is possible to shift on/off-timing of the transistors Q1a and Q1b by the control signals S21a and S21b. Three or more of the step-up transistors Q1 and the plurality of step-down transistors Q2 are also driven in a similar way.

In accordance with the converter 1D, the effects exerted by the converters 1A to 1C can be obtained, and in addition, it becomes possible to perform higher frequency drive than in the converters 1A to 1C.

Note that the converter 1D may be changed to be step-up or step-down following the configurations of the converters 1A and 1C. Moreover, either of the transistors Q1 and Q2 may be composed of a single transistor in a similar way to the converters 1A to 1C. Furthermore, either or both of the diodes D1 and D2 may be composed of single diodes in a similar way to the converters 1A to 1C. Moreover, the plurality of transistors Q1 may be collectively driven at the same timing, and the same also applies to the plurality of transistors Q2.

Fifth Preferred Embodiment

FIG. 27 shows a circuit diagram schematically showing a configuration of a converter 1E according to a fifth preferred embodiment. The converter 1E illustrated in FIG. 27 has a configuration in which a part of the bidirectional step-up/down converter 1B (see FIG. 13) according to the second preferred embodiment is multiplexed.

More specifically, two unit circuits 40 having the same configuration are connected in parallel to each other, and are thereby multiplexed. Each of the unit circuits 40 illustrated in FIG. 27 is composed of the main reactor L1, the transistors Q1 and Q2, the diodes D1 and D2, and the snubber circuit 10 in the bidirectional step-up/down converter 1B (see FIG. 13) according to the second preferred embodiment.

Then, in the example of FIG. 27, the two unit circuits 40 are multiplexed in such a manner that, the above-described one ends of the main reactors L1 are connected to each other so as to have an equal potential, the points on the high potential-side P are connected to each other so as to have an equal potential, the points of the ground potential N are connected to each other so as to have an equal potential, and the connection points between the snubber reactors Ls and the second snubber diodes Ds2 are connected to each other so as to have an equal potential. In such a configuration example, the capacitors C1 and C2 are shared for use by the two unit circuits 40.

In the step-up operation, the totally two step-up transistors Q1 may be sequentially turned on while shifting timing therebetween, or alternatively, may be collectively turned on at the same timing. The same also applied to the totally two step-down transistors Q2.

In accordance with the converter 1E, the effects exerted by the converters 1A to 1D can be obtained, and in addition, a ripple current can be suppressed. Moreover, the suppression of the ripple current makes it possible to reduce a capacity of each of the capacitors C1 and C2, and accordingly, downsizing of the capacitors C1 and C2, and further, the downsizing of the device can be achieved.

Note that three or more of the unit circuits 40 may be multiplexed. Moreover, the unit circuits 40 may be modified to be step-up or step-down following the configurations of the converters 1A and 1C. Furthermore, either or both of the transistors Q1 and Q2 may be changed to a plurality of transistors following the configuration of the converter 1D. Moreover, either or both of the diodes D1 and D2 may be changed to a plurality of diodes following the configuration of the converter 1D.

Sixth Preferred Embodiment

FIG. 28 shows a circuit diagram schematically showing a configuration of a converter 1F according to a sixth preferred embodiment. The converter 1F illustrated in FIG. 28 has a configuration in which a step-up detector 51 and a step-down detector 52 are added to the bidirectional step-up/down converter 1D (see FIG. 25) according to the fourth preferred embodiment. Other configurations of the converter 1F are basically similar to those of the converter 1D.

The step-up detector 51 detects information regarding operation states of the plurality of step-up transistors Q1, and transmits a detection result S51 to the control device 20. Moreover, the step-down detector 52 detects information regarding operation states of the plurality of step-down transistors Q2, and outputs a detection result S52 to the control device 20.

The step-up detector 51 may be composed so as to perform information detection for all of the transistors Q1 by attaching sensors and the like individually to the step-up transistors Q1, or alternately, may be composed so as to perform information detection only for a part of the step-up transistors Q1 in a representative manner. The same also applies to the step-down detector 52.

The control device 20 functions as a means that acquires the detection results S51 and S52 detected by the detector 51 and 52, and controlling, based on the detection results S51 and S52, so that the operations of the transistors Q1 and Q2 can turn to the optimum state defined in advance.

In a similar way to the above, also in the converter 1F, the snubber circuit 10 does not require the complicated control for itself. Therefore, in comparison with a configuration of also controlling the snubber circuit together with the switching transistors based on such detection results, a control method for the converter 1F is simple. Moreover, the matter that the control method is simple makes it possible to shorten a control time, in other words, enables real-time control.

Here, as described above, detection targets by the step-up detector 51 may be all of the transistors Q1 or a part of the transistors Q1. However, the operation states of all of the transistors Q1 are detected, thus making it possible to individually control the respective transistors Q1 based on the detection results. In accordance with such detailed individual control, for example, the plurality of transistors Q1 can be operated averagely, and this contributes to the efficiency enhancement and lifetime extension. Note that operation states exerting such effects are an example of the above-described optimum state. Such a point also applies to the step-down detector 52.

For example, in operation control for the transistors Q1 based on the detection result S51, processing for selecting the transistors Q1 as drive targets from among the plurality of step-up transistors Q1 based on the detection result S51 is included. In accordance with this, the selection of the transistors Q1 is performed in real time during the operation, and accordingly, the plurality of transistors Q1 can be operated averagely and stably, and this further contributes to the efficiency enhancement and the lifetime extension. Note that operation states exerting such effects are also an example of the above-described optimum state. Moreover, in accordance with such selection processing for the transistors Q1, it becomes unnecessary to perform, during manufacturing, selection for the transistors Q1 in terms of characteristics, in other words, ranking and management characteristic variations of the transistors Q1. Accordingly, the number of manufacturing steps, manufacturing cost and the like can be reduced. Such a point also applies to selection processing for the step-down transistors Q2.

As the above-described information to be detected by the detectors 51 and 52, collector currents of the transistors Q1 and Q2 are illustrated. Such currents are measurable, for example, by a variety of already-known means. Accordingly, in this example, such current measuring means can be provided in the detector 51 and 52. For example, a tail current tends to be extended at the time of a low current. Accordingly, in accordance with control performed based on the collector currents, it becomes possible to suppress such extension of the tail current by increasing the switching frequency. Meanwhile, there is an apprehension about a surge current at the time of a large current, and accordingly it becomes possible to suppress the surge current by reducing the switching frequency. These controls are also control examples for obtaining the above-described optimum state.

Moreover, as the above-described information to be detected by the detector 51 and 52, temperatures of the transistors Q1 and Q2 are illustrated. Such temperatures are measureable, for example, by a variety of already-known means. Accordingly, in this example, such temperature measuring means can be provided in the detectors 51 and 52. In accordance with control performed based on the element temperatures, for example, it becomes possible to control the operations of the transistors Q1 and Q2 so that the transistors Q1 and Q2 cannot reach the maximum junction temperature thereof. Moreover, it becomes possible to select the respective transistors in a good balance from a viewpoint of heat generation. These contribute to the lifetime extension. These controls are also control examples for obtaining the above-described optimum state.

Moreover, the detectors 51 and 52 may be composed so as to detect both of the collector currents of the transistors Q1 and Q2 and the temperatures of the transistors Q1 and Q2. In accordance with this, in comparison with the case of detecting only either one of the currents and the temperatures, it becomes possible to perform optimization with high accuracy. As a result, the efficiency enhancement, noise reduction, loss reduction and the like can be achieved.

Moreover, for example, in the operation control for the transistor Q1, processing for controlling gate resistance of the transistor Q1 (that is, input resistance to the control end of the switching element Q1) to be driven is included.

It is possible to perform such gate resistance control by a configuration in FIG. 29. Note that FIG. 29 schematically illustrates one of the transistors Q1. In an example of FIG. 29, a variable resistance means (or unit) 53 is connected to the gate of the transistor Q1, and it is possible to set a resistance value of the variable resistance means 53 by a control signal S23 from the control device 20. In accordance with such a configuration example, the control device 20 is capable of controlling the resistance value of the variable resistance means 53 based on the detection result S51 from the detector 51. Note that, as the variable resistance means 53, for example, a variety of already-known configurations capable of changing the resistance value are adoptable. The same also applies to control for gate resistance of the step-down transistor Q2.

For example, immediately after the transistors Q1 and Q2 are turned off, the gate resistances thereof are relatively increased, whereby current changes at turn-off become gentle. As a result, a switching surge voltage can be suppressed. Moreover, radiation noise can be suppressed by the suppression of the surge voltage. Furthermore, for example, the gate resistances are relatively reduced after the above-described increase thereof, and turn-off speeds of the transistors Q1 and Q2 are increased, whereby the switching loss can be reduced. Note that operation states exerting these effects are an example of the above-described optimum state.

Note that it is also possible to combine the detectors 51 and 52 with the converter 1A and the like, and the effects exerted by the converter 1A and the like can also be obtained.

Seventh Preferred Embodiment

In a seventh preferred embodiment, a description is made of a device structure of each of the above-described variety of converters. FIG. 30 illustrates a cross-sectional view of a converter 1G according to the seventh preferred embodiment. Note that, in FIG. 30, hatching is omitted for a part of components in order to avoid complicatedness of the drawing. A description is made here of the converter 1G on the assumption that the converter 1G concerned is equivalent to the converter 1B (FIG. 13) according to the second embodiment; however, the following description also applies to the converter 1A (see FIG. 1) and the like other than the converter 1B.

In accordance with an example of FIG. 30, the converter 1G includes a radiator plate (in other words, a heat sink) 101, a case 102, and a cover 103.

The radiator plate 102 is composed of metal, for example, such as copper. The radiator plate 101 also plays a role of a base plate on which a variety of components are mounted.

The case 102 has a portion that is erected on a peripheral edge portion of the radiator plate 101 and forms a recessed container together with the radiator plate 102. In the example of FIG. 30, the case 102 also has a portion that is protruded to an inside of the above-described recessed container, in other words, to a center portion side of the radiator plate 101. The case 102 is composed of an insulating material, for example, such as polyphenylene sulfide (PPS).

In the case 102, a variety of conductive parts 111 to 114, which compose terminals, electrodes and the like, are provided. Note that these parts 111 to 114 are not limited to the number of pieces illustrated in FIG. 30. For example, such terminals 111 are provided at positions not shown, and a plurality of the terminals 111 correspond to the low voltage-side connection ends and the high voltage-side connection ends.

The cover 103 attached to the case 102 on an opposite side to the radiator plate 101. The cover 103 is composed of an insulating material such as PPS.

The converter 1G further includes an insulating substrate 121, power semiconductor chips 122 and 123, and a capacitor 124 in the case 102 (in other words, in the above-described recessed container).

The insulating substrate 121 is composed of an insulating material such as ceramics, and is bonded onto the radiator plate 101 by solder and the like.

The power semiconductor chips 122 and 123 are bonded onto the insulating substrate 121 by solder and the like. In the power semiconductor chips 122 and 123, there are built power semiconductor elements (the transistors Q1 and Q2 and the diodes D1, D2, Ds1 and Ds2 in accordance with the example of the converter 1B (see FIG. 13)). In the example of FIG. 30, the power semiconductor chips 122 and 123 are subjected to electric connection by wires, and compose a predetermined electric circuit.

The capacitor 124 is the snubber capacitor Cs, and is arranged in contact with the radiator plate 101. The snubber capacitor 124 generates heat at the time when the converter 1G is operated. Accordingly, in accordance with such an arrangement, the heat generated from the snubber capacitor 124 can be efficiently transmitted to the radiator plate 101 and radiated therefrom. Therefore, a capacity of the snubber capacitor 124 can be reduced, and further, downsizing thereof can be achieved by the reduction of the capacity.

A terminal 125 of the capacitor 124 is connected to the electrode 114, which is provided in the case 102, by at least one connection method of soldering, welding, ultrasonic bonding and screw fastening. The connection method just needs to be appropriately selected in accordance with relative positions, postures and the like of the terminal 125 and the case electrode 114, and by such an appropriate connection method, the capacitor 124 and the case electrode 114 can be efficiently connected to each other. Moreover, in accordance with the appropriate connection method, lifetime extension of a connection portion, in other words, lifetime extension of the converter 1G can be achieved.

The power semiconductor chips 122 and 123 and the like are sealed by a filler material 126. As the filler material 126, for example, silicon resin, epoxy resin and the like are used.

Note that, though not shown in FIG. 30, a part or all of the capacitors C1 and C2 and the reactors L1 and Ls may be arranged in an inside of the case 102 or on an outside of the case 102.

As described above, the transistors Q1 and Q2, the snubber capacitor Cs (capacitor 124 in FIG. 30) and the snubber diodes Ds1 and Ds2 are converged into the single case 102. Therefore, wiring inductance can be reduced by shortening wires which connect the respective elements to one another. Moreover, a surge can be reduced by reducing the wiring inductance.

The converter 1G further includes a control board 131, and a shield plate 132 in the case 102.

The control board 131 is a board on which the control device 20 (see FIG. 13 and the like) is formed, and in the example of FIG. 30, is connected to the electrode 112.

The shield plate 132 is arranged between the control board 131 and the power semiconductor chips 122 and 123, and shields electrical (or electromagnetic) interference between the control device 20 and the power semiconductor chips 122 and 123. The shield plate 132 is composed of, for example, a conductive material.

Note that the control board 131 is sometimes arranged on the outside of the case 102, and following this, the shield plate 132 is also sometimes arranged on the outside of the case 102.

While the invention has been shown and described in detail, the foregoing description is in all aspects illustrative and not restrictive. It is therefore understood that numerous modifications and variations can be devised without departing from the scope of the invention.

What is claimed is:

1. A DC-DC converter comprising:
   a main reactor having one end and other end;
   at least one step-up switching element having a current input end connected to said other end of said main reactor, a current output end to be connected to a ground potential, and a control end that receives a control signal for controlling on/off between said current input end and said current output end;
   at least one step-up diode having an anode connected to said current input end of said at least one step-up switching element and said other end of said main reactor;
   a snubber capacitor having one end connected to said anode of said at least one step-up diode, said current input end of said at least one step-up switching element and said other end of said main reactor;
   a first snubber diode having a cathode connected to other end of said snubber capacitor, and an anode connected to a cathode of said at least one step-up diode;
   a second snubber diode having an anode connected to said cathode of said first snubber diode and said other end of said snubber capacitor;
   a snubber reactor having one end connected to said anode of said first snubber diode, and other end connected to a cathode of said second snubber diode; and
   a capacitor having one end connected to said other end of said snubber reactor and said cathode of said second snubber diode, and other end to be connected to said ground potential.

2. The DC-DC converter according to claim 1, wherein
   said at least one step-up switching element is a plurality of step-up switching elements connected in parallel to one another in an identical orientation, and
   the DC-DC converter further comprises means that sequentially turns on said plurality of step-up switching elements while shifting timing thereamong.

3. The DC-DC converter according to claim 1, comprising a plurality of unit circuits which have an identical configuration and are multiplexed by being connected in parallel to one another, said plurality of unit circuits each including said main reactor, said at least one step-up switching element, said at least one step-up diode, said snubber capacitor, said first snubber diode, said second snubber diode, and said snubber reactor.

4. The DC-DC converter according to claim 1, further comprising:
   a step-up detector that detects information regarding operation states of a part or all of elements among said at least one step-up switching element; and
   means that controls an operation of said at least one step-up switching element based on a detection result by said step-up detector.

5. The DC-DC converter according to claim 4, wherein
   said at least one step-up switching element is a plurality of step-up switching elements connected in parallel to one another in an identical orientation, and
   said step-up detector detects information regarding an operation state of each of said plurality of step-up switching elements.

6. The DC-DC converter according to claim 5, wherein
   said means that controls the operation of said at least one step-up switching element selects an element to be driven from among said plurality of step-up switching elements based on said detection result by said step-up detector.

7. The DC-DC converter according to claim 4, wherein said information to be detected by said step-up detector includes at least one of:
a current flowing through said at least one step-up switching element; and
a temperature of said at least one step-up switching element.

8. The DC-DC converter according to claim 4, wherein said means that controls the operation of said at least one step-up switching element controls the operation of said at least one step-up switching element by controlling input resistance to said control end of said at least one step-up switching element.

9. The DC-DC converter according to claim 1, wherein said at least one step-up switching element, said at least one step-up diode, said snubber capacitor, said first snubber diode, and said second snubber diode are converged into a single case.

10. The DC-DC converter according to claim 9, further comprising
a radiator plate in contact with said snubber capacitor.

11. The DC-DC converter according to claim 10, wherein said snubber capacitor is connected to an electrode of said case by at least one connection method of soldering, welding, ultrasonic bonding, and screw fastening.

12. The DC-DC converter according to claim 1, further comprising:
at least one step-down switching element having a current input end connected to said cathode of said at least one step-up diode, a current output end connected to said anode of said at least one step-up diode, and a control end that receives a control signal for controlling on/off between said current input end and said current output end; and
at least one step-down diode having a cathode and an anode, which are connected to said current input end and current output end of said at least one step-up switching element, respectively.

13. The DC-DC converter according to claim 12, wherein said at least one step-down switching element is a plurality of step-down switching elements connected in parallel to one another in an identical orientation, and
the DC-DC converter further comprises means that sequentially turns on said plurality of step-down switching elements while shifting timing thereamong.

14. The DC-DC converter according to claim 12, wherein a plurality of unit circuits which have an identical configuration and are multiplexed by being connected in parallel to one another, said plurality of unit circuits each including said main reactor, said at least one step-up switching element, said at least one step-up diode, said snubber capacitor, said first snubber diode, said second snubber diode, and said snubber reactor; and
each of said plurality of unit circuits further includes said at least one step-down switching element, and said at least one step-down diode.

15. The DC-DC converter according to claim 12, further comprising:
a step-down detector that detects information regarding operation states of a part or all of elements among said at least one step-down switching element; and
means that controls an operation of said at least one step-down switching element based on a detection result by said step-down detector.

16. The DC-DC converter according to claim 15, wherein said at least one step-down switching element is a plurality of step-down switching elements connected in parallel to one another in an identical orientation, and
said step-down detector detects information regarding an operation state of each of said plurality of step-down switching elements.

17. The DC-DC converter according to claim 16, wherein said means that controls the operation of said at least one step-down switching element selects an element to be driven target from among said plurality of step-down switching elements based on said detection result by said step-down detector.

18. The DC-DC converter according to claim 15, wherein said information to be detected by said step-down detector includes at least one of:
a current flowing through said at least one step-down switching element; and
a temperature of said at least one step-down switching element.

19. The DC-DC converter according to claim 15, wherein said means that controls the operation of said at least one step-down switching element controls the operation of said at least one step-down switching element by controlling input resistance to said control end of said at least one step-down switching element.

20. The DC-DC converter according to claim 12, wherein said at least one step-up switching element, said at least one step-up diode, said snubber capacitor, said first snubber diode, and said second snubber diode are converged into a single case; and
said at least one step-down switching element and said at least one step-down diode are further converged into said single case.

21. A DC-DC converter comprising:
a main reactor having one end and other end;
at least one step-down switching element having a current output end connected to said other end of said main reactor, a current input end, and a control end that receives a control signal for controlling on/off between said current input end and said current output end;
at least one step-down diode having a cathode connected to said current output end of said at least one step-down switching element and said other end of said main reactor, and an anode to be connected to a ground potential;
a snubber capacitor having one end connected to said cathode of said at least one step-down diode, said current output end of said at least one step-down switching element, and said other end of said main reactor;
a first snubber diode having a cathode connected to other end of said snubber capacitor, and an anode connected to said current input end of said at least one step-down switching element;
a second snubber diode having an anode connected to said cathode of said first snubber diode and said other end of said snubber capacitor;
a snubber reactor having one end connected to said anode of said first snubber diode, and other end connected to a cathode of said second snubber diode; and
a capacitor having one end connected to said other end of said snubber reactor and said cathode of said second snubber diode, and other end to be connected to said ground potential.

22. The DC-DC converter according to claim 21, wherein said at least one step-down switching element is a plurality of step-down switching elements connected in parallel to one another in an identical orientation, and the DC-DC converter further comprises means that sequentially turns on said plurality of step-down switching elements while shifting timing thereamong.

23. The DC-DC converter according to claim 21, comprising
a plurality of unit circuits which have an identical configuration and are multiplexed by being connected in parallel to one another, said plurality of unit circuits each including said main reactor, said at least one step-down switching element, said at least one step-down diode, said snubber capacitor, said first snubber diode, said second snubber diode, and said snubber reactor.

24. The DC-DC converter according to claim 21, further comprising:
a step-down detector that detects information regarding operation states of a part or all of elements among said at least one step-down switching element; and
means that controls an operation of said at least one step-down switching element based on a detection result by said step-down detector.

25. The DC-DC converter according to claim 24, wherein said at least one step-down switching element is a plurality of step-down switching elements connected in parallel to one another in an identical orientation, and
said step-down detector detects information regarding an operation state of each of said plurality of step-down switching elements.

26. The DC-DC converter according to claim 25, wherein said means that controls the operation of said at least one step-down switching element selects an element to be driven from among said plurality of step-down switching elements based on said detection result by said step-down detector.

27. The DC-DC converter according to claim 24, wherein said information to be detected by said step-down detector includes at least one of:
a current flowing through said at least one step-down switching element; and
a temperature of said at least one step-down switching element.

28. The DC-DC converter according to claim 24, wherein said means that controls the operation of said at least one step-down switching element controls the operation of said at least one step-down switching element by controlling input resistance to said control end of said at least one step-down switching element.

29. The DC-DC converter according to claim 21, wherein said at least one step-down switching element, said at least one step-down diode, said snubber capacitor, said first snubber diode, and said second snubber diode are converged into a single case.

30. The DC-DC converter according to claim 29, further comprising
a radiator plate in contact with said snubber capacitor.

31. The DC-DC converter according to claim 30, wherein said snubber capacitor is connected to an electrode of said case by at least one connection method of soldering, welding, ultrasonic bonding, and screw fastening.

* * * * *